US012573589B2

(12) United States Patent     (10) Patent No.: US 12,573,589 B2
Wu et al.            (45) Date of Patent: Mar. 10, 2026

(54) SYNCHRONIZATION OF RF GENERATORS

(71) Applicant: Lam Research Corporation, Fremont, CA (US)

(72) Inventors: Ying Wu, Livermore, CA (US); John Stephen Drewery, San Jose, CA (US); Alexander Miller Paterson, San Jose, CA (US); Xiang Zhou, Mountain View, CA (US); Zhuoxian Wang, Fremont, CA (US); Yoshie Kimura, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 88 days.

(21) Appl. No.: 18/740,449

(22) Filed: Jun. 11, 2024

(65) Prior Publication Data

US 2024/0331976 A1     Oct. 3, 2024

Related U.S. Application Data

(63) Continuation of application No. 18/012,212, filed as application No. PCT/US2021/051943 on Sep. 24, 2021, now Pat. No. 12,046,450.

(60) Provisional application No. 63/085,130, filed on Sep. 29, 2020.

(51) Int. Cl.
*H01J 37/32*       (2006.01)

(52) U.S. Cl.
CPC .. *H01J 37/32146* (2013.01); *H01J 37/32174* (2013.01); *H01J 37/32091* (2013.01); *H01J 37/321* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 8,040,068 B2 * | 10/2011 | Coumou | H01J 37/32174 |
| | | | 315/111.41 |
| 8,692,467 B2 | 4/2014 | Benjamin et al. | |
| 9,368,329 B2 | 6/2016 | Valcore, Jr. et al. | |
| 9,595,424 B2 * | 3/2017 | Marakhtanov | H01J 37/3255 |
| 11,536,755 B2 * | 12/2022 | Fisk, II | H01J 37/32091 |

FOREIGN PATENT DOCUMENTS

KR    10-2016-0143539 A    12/2016

* cited by examiner

*Primary Examiner* — Jeffrey S Zweizig
(74) *Attorney, Agent, or Firm* — Polygon IP, LLP

(57) ABSTRACT

Systems and methods for synchronization of radio frequency (RF) generators are described. One of the methods includes receiving, by a first RF generator, a first recipe set, which includes information regarding a first plurality of pulse blocks for operating the first RF generator. The method further includes receiving, by a second RF generator, a second recipe set, which includes information regarding a second plurality of pulse blocks for operating a second RF generator. Upon receiving a digital pulsed signal, the method includes executing the first recipe set and executing the second recipe set. The method further includes outputting a first one of the pulse blocks of the first plurality based on the first recipe set in synchronization with a synchronization signal. The method includes outputting a first one of the pulse blocks of the second plurality based on the second recipe set in synchronization with the synchronization signal.

21 Claims, 13 Drawing Sheets

(Sync from Host Computer)

(Master RFG - Sync Via Ethernet)

(Master RFG - Sync Via EtherCAT)

(Sync from Host Computer)

(CCP)

(TCP)

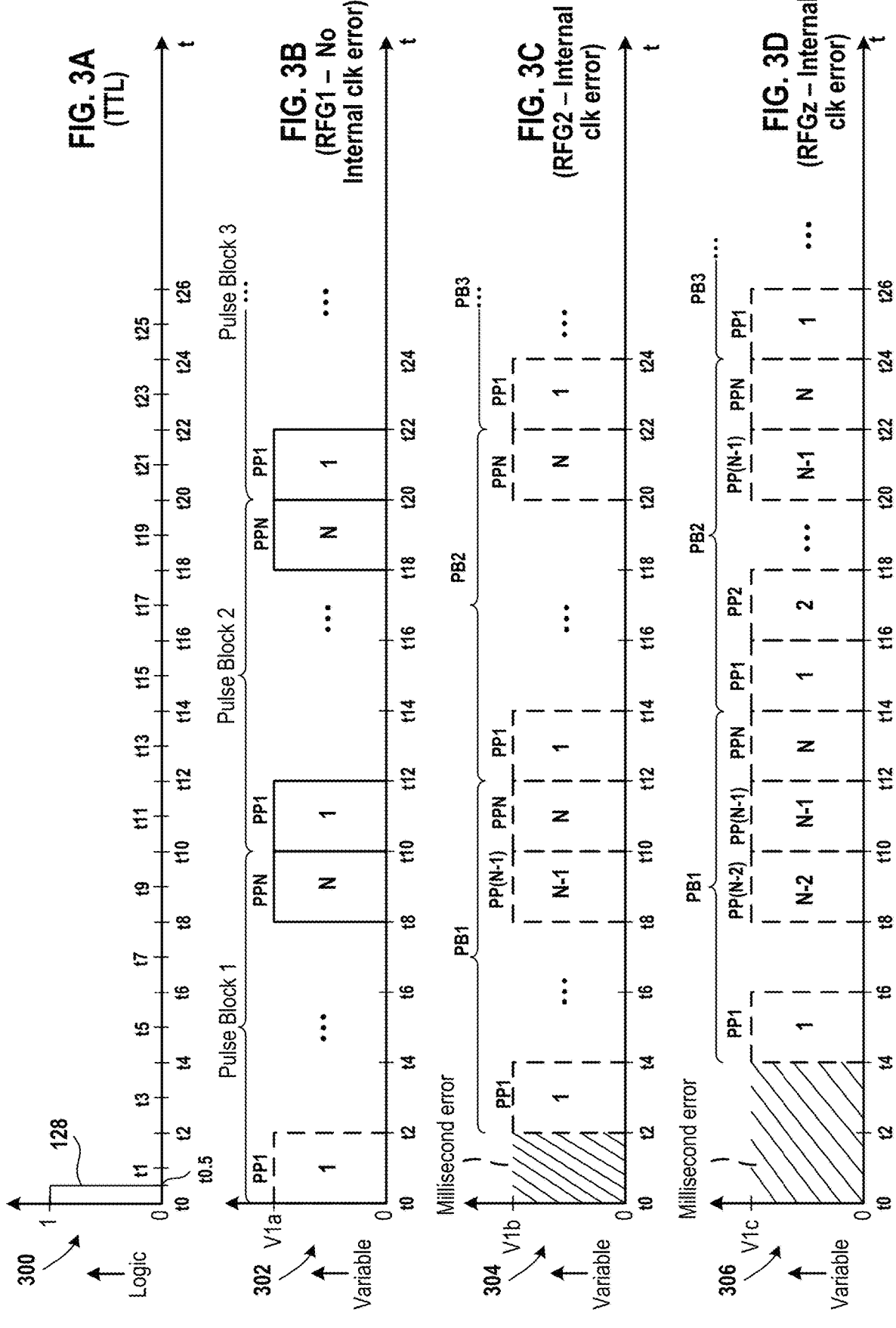

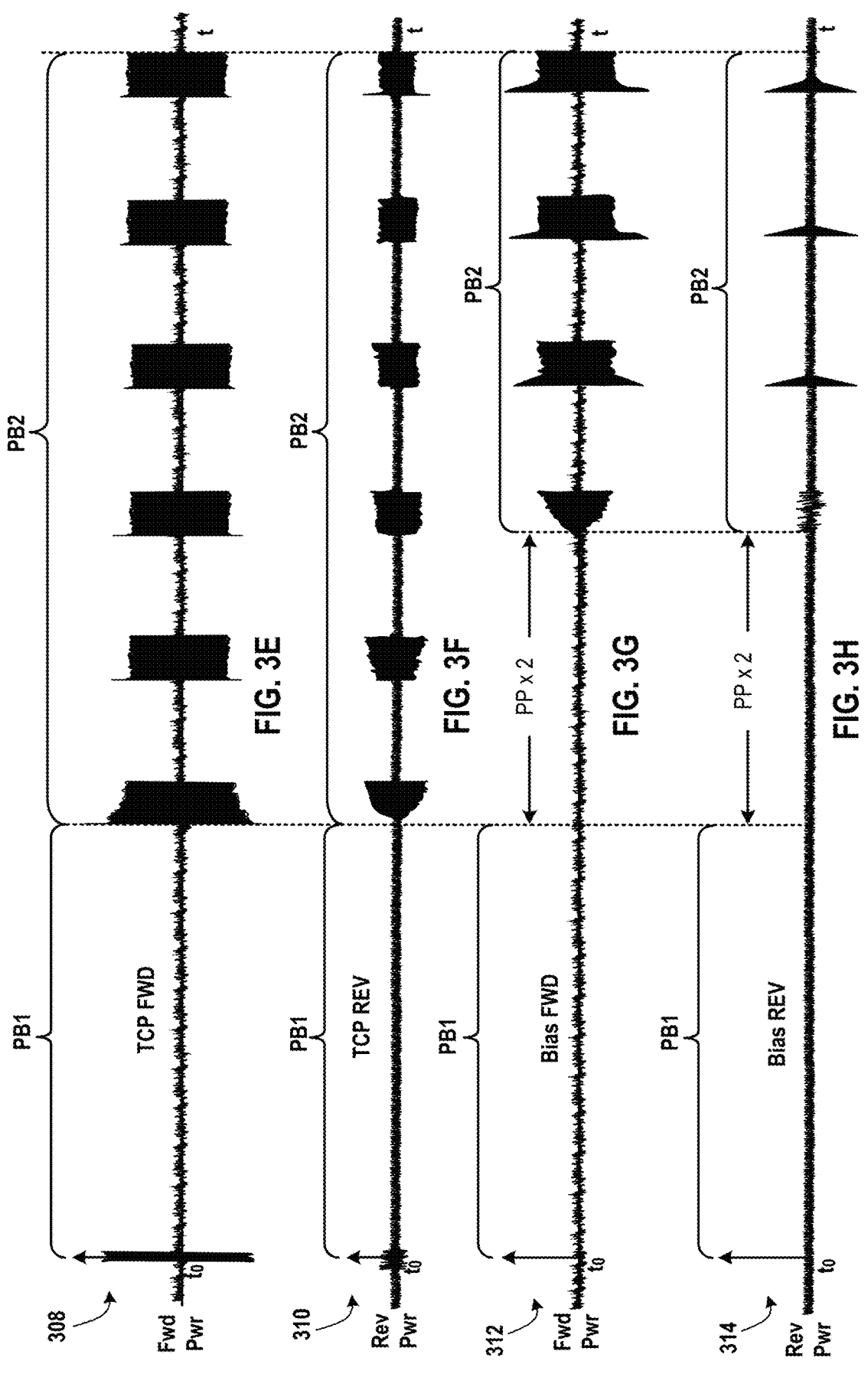

(Sync Signal)

(RFG2 – Error Fixed)

FIG. 4C (RFGz – Error Fixed)

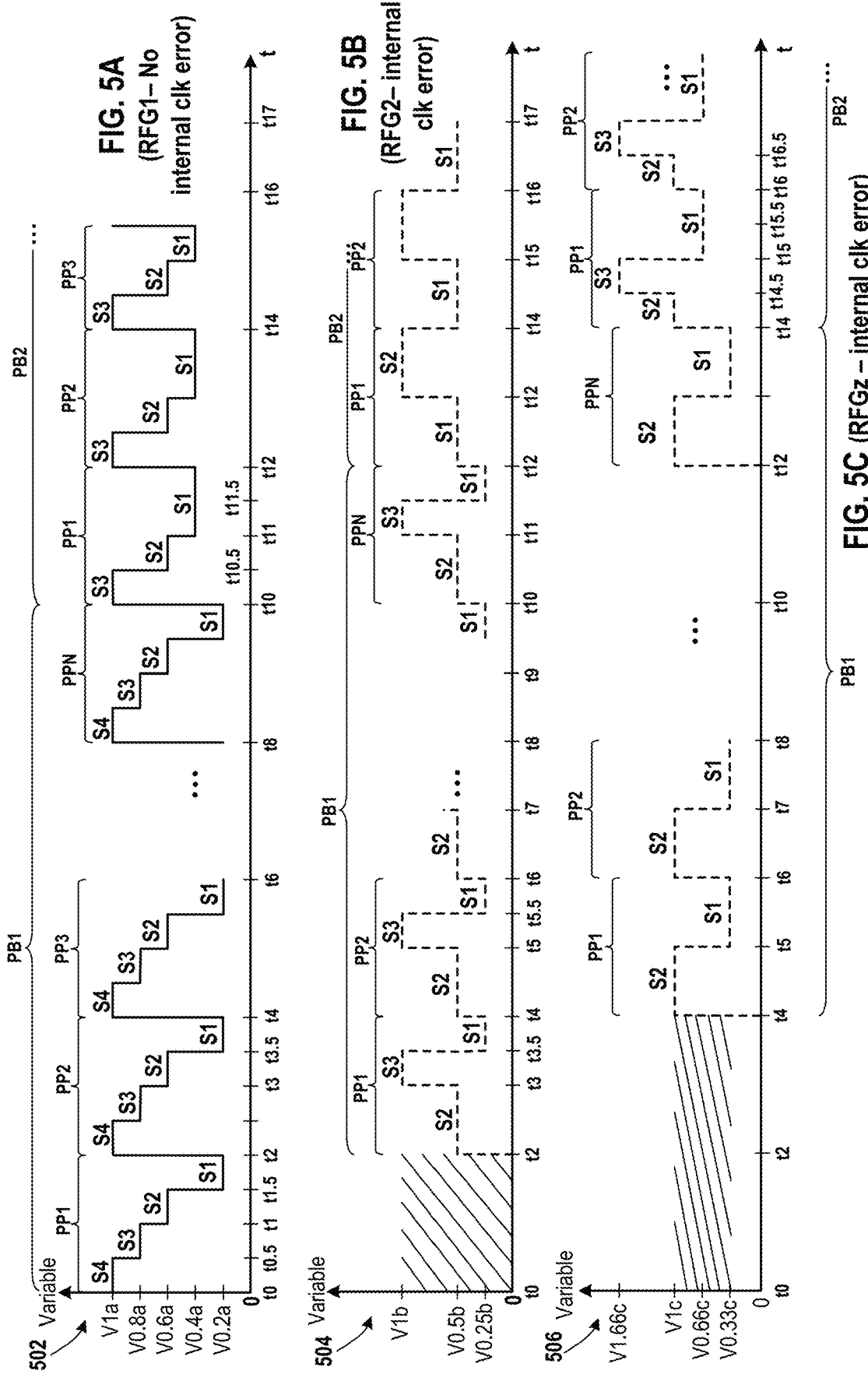
FIG. 5A (RFG1– No internal clk error)
FIG. 5B (RFG2– internal clk error)
FIG. 5C (RFGz – internal clk error)

(Sync Signal)

(RFG2– internal clk error fixed)

(RFGz – internal clk error fixed)

(Sync from Master RFG – Ethernet)

(Sync from Master RFG – EtherCAT)

1

SYNCHRONIZATION OF RF GENERATORS

CLAIM OF PRIORITY

This application is a continuation of and claims the benefit of and priority, under 35 U.S.C. § 120, to U.S. patent application Ser. No. 18/012,212, filed on Dec. 21, 2022, and titled "SYNCHRONIZATION OF RF GENERATORS", which is a national stage filing of and claims priority, under 35 U.S.C. § 371, to PCT/US2021/51943, filed on Sep. 24, 2021, and titled "SYNCHRONIZATION OF RF GENERA-TORS", which claims the benefit of and priority, under 35 U.S.C. § 119 (c), to U.S. Provisional Patent Application No. 63/085,130, filed on Sep. 29, 2020, and titled "SYNCHRO-NIZATION OF RF GENERATORS", all of which are incorporated by reference herein in their entirety.

FIELD

The present embodiments relate to systems and methods for synchronization of radio frequency (RF) generators.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A plasma tool includes multiple radio frequency (RF) generators. The RF generators are coupled to a plasma chamber. A substrate is placed in the plasma chamber. The RF generators generate RF signals, which are supplied to the plasma chamber to generate plasma, which is used to process the substrate.

Many substrates are processed using the RF generators and the plasma chamber. It is desirable that the substrates are processed in a desirable manner to achieve desired results.

It is in this context that embodiments described in the present disclosure arise.

SUMMARY

Embodiments of the disclosure provide systems, apparatus, methods and computer programs for synchronization of radio frequency (RF) generators. It should be appreciated that the present embodiments can be implemented in numerous ways, e.g., a process, an apparatus, a system, a device, or a method on a computer readable medium. Several embodiments are described below.

A pulsing scheme includes pulsing a pattern of two or more different power states, such as power levels, and repeating the pattern for on an order of several seconds to hundreds of seconds. The pattern involves pulsing a pulse block portion, which is made up of two or more power states with different durations and RF frequencies with the capability to frequency tune in each state. A pulse block includes multiple pulse block portions that are chained together one after another and then repeated. Each pulse block portion is on the order of 10 to 1000 milliseconds (ms) in duration, and each pulse block can be different in terms of power and duration for each RF generator. Usually, a single sync pulse transistor-transistor logic (TTL) signal is used to synchronize all the RF generators on a single rising edge. However, relying on the TTL signal to consistently set the RF generators for all the pulse blocks may not account for a timing slip. The timing slip may occur as a result of a malfunction of an internal clock of one of the RF generators.

The systems and methods, described herein, utilize an analog signal to toggle high and low every time a pulse block, such as a pulse block 1 or a pulse block N, should start, thereby providing a timing for all the RF generators to start and end the pulse block together, and provides a way to continuous synchronize the RF generators in case one RF generator begins to slip in time, where N is a positive integer.

Control of ion flux and neutral flux is an important aspect of plasma processing, such as plasma etching, to process multiple substrates in a desirable manner. By pulsing the RF generators in a controlled manner with a precise number of pulses or pulse blocks, a greater control over the ion flux and neutral flux is achieved. A method of synchronizing the RF generators, via an Ethernet for Control Automation System (EtherCAT) (ECAT) train or the analog signal is described to start and stop each pulse block so that all the RF generators are aligned as to when the pulse block starts and stops.

By using the analog signal derived from one of the RF generators or a signal generator, a synchronization signal, such as a central time clock, is generated and sent to all the RF generators to notify each of the RF generators when to start and end their respective pulse block. Information regarding the synchronization signal is embedded within the ECAT train. Also, the analog signal is an example of the synchronization signal. The ECAT train can be used in a slave-to-slave fashion to control synchronization of the RF generators in generating their corresponding pulse blocks. By sending a pulse of the synchronization signal periodically on the start of every pulse block, any delays in time by any of the RF generators can be corrected for every clock cycle.

By providing the synchronization signal to instruct the RF generators when to start a pulse block, any errors in timing created by computer-software or timers or internal clocks within each of the RF generators are corrected. The systems and methods described herein provide a manner of aligning pulse blocks of the RF generators.

In an embodiment, a method for synchronization of RF generators is described. The method includes receiving, by a first RF generator, a first recipe set, which includes information regarding a first plurality of pulse blocks for operating the first RF generator. The method further includes receiving, by a second RF generator, a second recipe set, which includes information regarding a second plurality of pulse blocks for operating a second RF generator. The method also includes receiving, by the first and second RF generators, a digital pulsed signal. Upon receiving the digital pulsed signal, the method includes executing, by the first RF generator, the first recipe set and executing, by the second RF generator, the second recipe set. The method further includes outputting, by the first RF generator, a first one of the pulse blocks of the first plurality based on the first recipe set in synchronization with a synchronization signal. The method includes outputting, by the second RF generator, a first one of the pulse blocks of the second plurality based on the second recipe set in synchronization with the synchronization signal.

In an embodiment, a system for synchronization of RF generators is described. The system includes a first RF generator configured to receive a first recipe set, which includes information regarding a first plurality of pulse blocks for operating the first RF generator. The system further includes a second RF generator configured to receive a second recipe set, which includes information regarding a second plurality of pulse blocks for operating the second RF generator. The first and second RF generators are configured to receive a digital pulsed signal. Upon receiving the digital pulsed signal, the first RF generator is configured to execute the first recipe set and the second RF generator is configured to execute the second recipe set. During the execution of the first recipe set, the first RF generator is configured to generate a synchronization signal and provide the synchronization signal to the second RF generator. The first RF generator is configured to output a first one of the pulse blocks of the first plurality based on the first recipe set in synchronization with the synchronization signal. Upon receiving the synchronization signal, the second RF generator is configured to output a first one of the pulse blocks of the second plurality based on the second recipe set in synchronization with the synchronization signal.

In one embodiment, a system for synchronization of RF generators is described. The system includes a first RF generator configured to receive a first recipe set, which includes information regarding a first plurality of pulse blocks for operating the first RF generator. The system includes a second RF generator configured to receive a second recipe set, which includes information regarding a second plurality of pulse blocks for operating the second RF generator. The system includes a host computer coupled to the first and second RF generators. The host computer is configured to generate a digital pulsed signal and a synchronization signal. The first and second RF generators are configured to receive the digital pulsed signal and the synchronization signal from the host computer. Upon receiving the digital pulsed signal, the first RF generator is configured to execute the first recipe set and the second RF generator is configured to execute the second recipe set. Also, upon receiving the synchronization signal, the first RF generator is configured to output a first one of the pulse blocks of the first plurality based on the first recipe set in synchronization with the synchronization signal. Upon receiving the synchronization signal, the second RF generator is configured to output a first one of the pulse blocks of the second plurality based on the second recipe set in synchronization with the synchronization signal.

Some advantages of the herein described systems and methods include reducing a delay that is created by an internal clock of an RF generator. The synchronization signal is generated. As an example, the synchronization signal is sent to the RF generator after sending a recipe signal to the RF generator. Also, a trigger signal for executing recipe information within the recipe signal is sent to the RF generator. Upon receiving the trigger signal, the recipe information is executed by the RF generator. A current pulse block within the recipe information is generated at a time a pulse of the synchronization signal is received by the RF generator. Any remaining portions of a preceding pulse block are not generated by the RF generator. When the remaining portions are not generated, and the current pulse block is generated, synchronization is achieved between the synchronization signal and the current pulse block. The synchronization facilitates achieving a desirable result in processing multiple wafers.

Other aspects will become apparent from the following detailed description, taken in conjunction with the accompanying drawings.

BRIEF DESCRIPTION OF THE DRA WINGS

The embodiments may best be understood by reference to the following description taken in conjunction with the accompanying drawings.

FIG. 3A depicts a graph to illustrate a transistor-transistor (TTL) signal.

FIG. 3B depicts a graph to illustrate multiple pulse blocks of an RF signal that is generated by an RF generator.

FIG. 3C depicts a graph to illustrate multiple pulse blocks of an RF generator that is generated by the RF generator when the RF generator does not receive the synchronization signal.

FIG. 3D depicts a graph to illustrate multiple pulse blocks of an RF generator that is generated by the RF generator when the RF generator does not receive the synchronization signal.

FIG. 3E depicts a graph to illustrate forward (FWD) power of an RF signal that is supplied by an RF generator.

FIG. 3F depicts a graph to illustrate reverse (REV) power that is received by an RF generator.

FIG. 3G depicts a graph to illustrate forward power of an RF signal that is supplied by an RF generator.

FIG. 3H depicts a graph to illustrate reverse power that is received by an RF generator.

FIG. 4C depicts a graph to illustrate that a delay in multiple pulse blocks of an RF signal generated by an RF generator is reduced by the synchronization signal.

FIG. 5A depicts a graph to illustrate each pulse block of an RF signal.

FIG. 5B depicts a graph to illustrate each pulse block of an RF signal.

FIG. 5C depicts a graph to illustrate each pulse block of an RF signal.

DETAILED DESCRIPTION

The following embodiments describe systems and methods for synchronization of radio frequency (RF) generators.

It will be apparent that the present embodiments may be practiced without some or all of these specific details. In other instances, well known process operations have not been described in detail in order not to unnecessarily obscure the present embodiments.

Figure 1A:
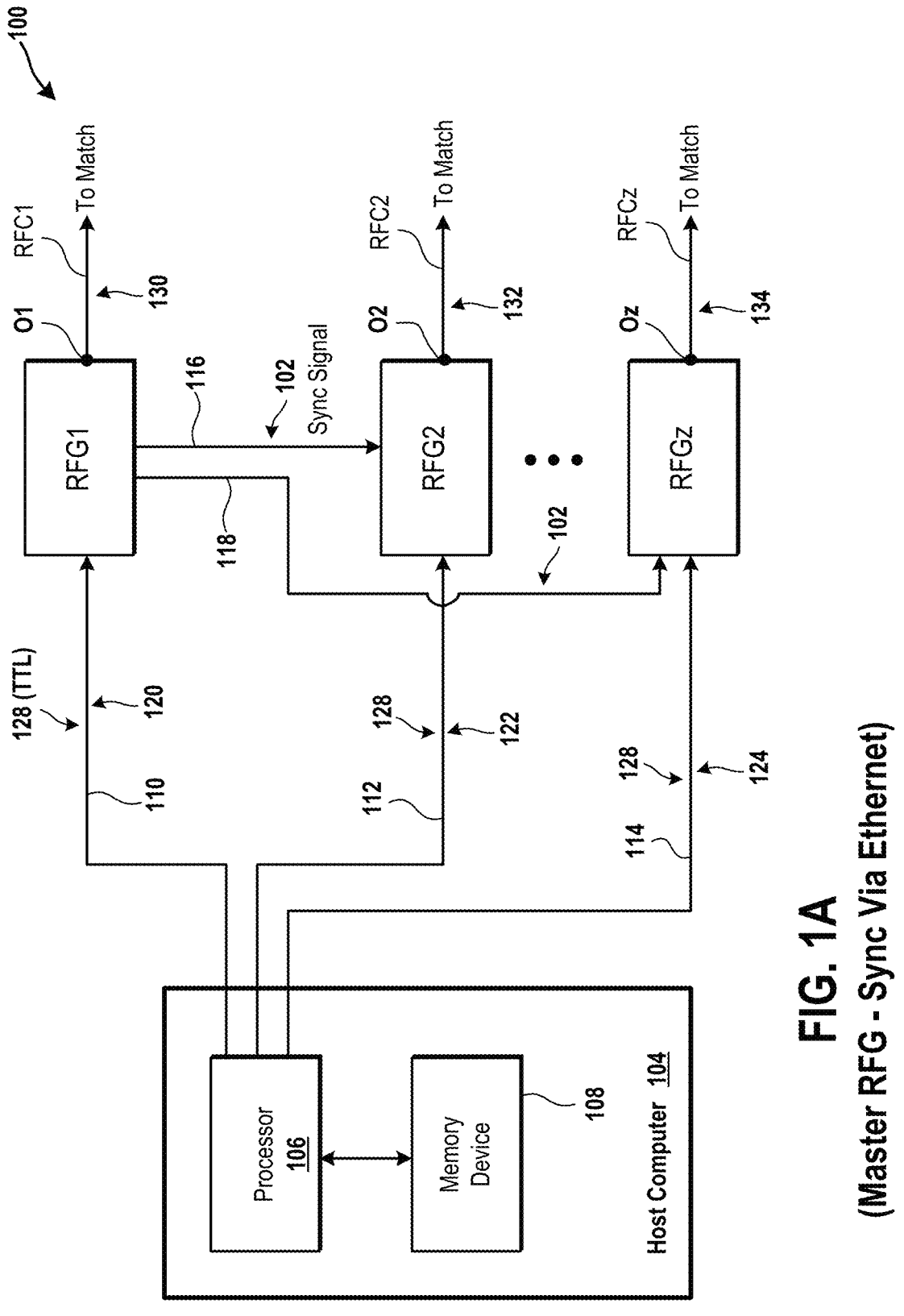
FIG. 1A is a diagram of an embodiment of a system to illustrate use of a synchronization signal to synchronize operation of multiple radio frequency (RF) generators.

FIG. 1A is a diagram of an embodiment of a system 100 to illustrate use of a synchronization signal 102 to synchronize operation of multiple RF generators (RFGs) 1, 2, and z, where z is a positive integer. Examples of the synchronization signal 102 include a digital signal and an analog signal. The system 100 includes the RF generators 1 through z, and a host computer 104. Examples of the host computer 104 include a desktop computer, a laptop computer, a tablet, and a smart phone. Examples of an RF generator, as used herein, include an RF generator having an operating frequency of 100 kilohertz (kHz), and RF generator having an operating frequency of 400 kilohertz, an RF generator having an operating frequency of 2 megahertz (MHz), and RF generator having an operating frequency of 13.56 MHz, an RF generator having an operating frequency of 27 MHz, and an RF generator having an operating frequency of 60 MHz.

The host computer 104 includes a processor 106 and a memory device 108. As used herein, a processor is an application specific integrated circuit (ASIC), or a programmable logic device (PLD), or a central processing unit (CPU), or a microprocessor, or a microcontroller. Examples of a memory device include a random access memory (RAM) and a read-only memory (ROM). To illustrate, a memory device is a flash memory, a hard disk, or a storage device, etc. A memory device is an example of a computer-readable medium. The processor 106 is coupled to the memory device 108.

The processor 106 is coupled to the RF generators 1 through z. For example, the processor 106 is coupled to the RF generator 1 via a transfer cable 110, is coupled to the RF generator 2 via a transfer cable 112, and is coupled to the RF generator z via a transfer cable 114. Examples of a transfer cable include a coaxial cable and a universal serial bus (USB) cable. To illustrate, the transfer cable is used for transfer of data in a serial manner, or in a parallel manner, or via a USB protocol.

Also, the RF generator 1 is coupled to the RF generators 2 through z. For example, the RF generator 1 is coupled to the RF generator 2 via a communication cable 116 and is coupled to the RF generator z via a communication cable 118. To illustrate, the RF generator 1 acts as a master and the RF generators 2 through z act as slaves. As such, the RF generator 1 is coupled with each other the RF generators 2 through z in a master slave configuration. Examples of a communication cable, as used herein, include an Ethernet cable. Examples of an Ethernet cable, as used herein, include a twisted pair cable. To illustrate, the Ethernet cable is a 100BASE-TX™ or a 100BASE-T4™ cable that is capable of transferring data at a speed of 100 megabits per second (Mbps) or greater.

The RF generator 1 has an output O1 that is coupled to an RF cable RFC 1. Similarly, the RF generator 2 has an output O2 that is coupled to an RF cable RFC 2 and the RF generator z has an output Oz that is coupled to an RF cable RFC z.

Two or more of the RF generators 1 through z are coupled to the same impedance matching network or to different impedance matching networks. For example, the RF generators 1 and 2 are coupled via the respective RF cables RFC 1 and RFC 2 to a first impedance matching network and the RF generator z is coupled to a second impedance matching network. As another example, the RF generators 1 through z are coupled via the respective RF cables RFC 1 through RFC z to the same impedance matching network. As yet another example, the RF generators 2 and z are coupled via the respective RF cables RFC 2 and RFC z to a first impedance matching network and the RF generator 1 is coupled via the RF cable RFC 1 to a second impedance matching network.

An example of an impedance matching network, as used herein, is an impedance matching circuit including a network of circuit components, such as inductors, resistors, and capacitors. To illustrate, the impedance matching network has one or more series circuits and one or more shunt circuits. Each series circuit includes one or more inductors and one or more capacitors that are coupled in series with each other. Similarly, each shunt circuit includes one or more inductors and one or more capacitors that are coupled in series with each other, and one of the one or more inductors and the one or more capacitors of the shunt circuit is coupled to a ground potential. Each of the one or more shunt circuits is coupled to a corresponding one of the one or more series circuits. The terms impedance matching network, impedance matching circuit, impedance matching housing, match housing, and match are used herein interchangeably.

The processor 106 accesses recipe information for each of the RF generators 1 through z from the memory device 108, and sends the recipe information to the RF generator. For example, the processor 106 obtains recipe information for the RF generator 1 from the memory device 108 and embeds the recipe information within a recipe signal 120, and sends the recipe signal 120 via the transfer cable 110 to the RF generator 1. As another example, the processor 106 obtains recipe information for the RF generator 2 from the memory device 108 and embeds the recipe information within a recipe signal 122, and sends the recipe signal 122 via the transfer cable 112 to the RF generator 2. As yet another example, the processor 106 obtains recipe information for the RF generator z from the memory device 108 and embeds the recipe information within a recipe signal 124, and sends the recipe signal 124 via the transfer cable 114 to the RF generator z.

As an example, recipe information, as used herein, for an RF generator includes a number of pulse blocks of an RF signal to be generated by the RF generator. Examples of pulse blocks are provided below. The recipe information for the RF generator further includes a time interval of each pulse period in a pulse block and a number of pulse periods within each pulse block. In addition, the recipe information for the RF generator includes a number of states of the RF signal during each pulse period, a duty cycle for each of the states, and a variable level for each of the states. The duty cycle of a state is a time interval of occurrence of the state. As an example, the variable level is a frequency level or a power level. To illustrate, the variable level includes one or more power values or one or more frequency values.

It should be noted that a pulse period is a time interval or a time period. It should further be noted that as an example, each pulse period of a pulse block of an RF signal has the same time interval. To illustrate, a time interval of a first pulse period of a pulse block of an RF signal is equal to a time interval of a second pulse period of the pulse block.

Also, as an example, a first variable level for a first state is different from a second variable level for a second state. To illustrate, the first variable level is greater than or lower than the second variable level. To further illustrate, values of the first variable level exclude values of the second variable level. When the first variable level is greater than the second variable level, a minimum of all values of the first variable level is greater than a maximum of all values of the second variable level. Each variable level includes one or more values of a variable.

A processor system of each RF generator 1 through z stores the recipe information received from the processor 106 within one or more memory devices of the RF generator. For example, the processor system of the RF generator 1 receives the recipe signal 120, extracts the recipe information from the recipe signal 120, and stores the recipe information within the one or more memory devices of the RF generator 1. Similarly, the processor system of the RF generator 2 receives the recipe signal 122, extracts the recipe information from the recipe signal 122, and stores the recipe information within the one or more memory devices of the RF generator 2. Also, the processor system of the RF generator z receives the recipe signal 124, extracts the recipe information from the recipe signal 124, and stores the recipe information within the one or more memory devices of the RF generator z.

The processor 106 sends a digital pulsed signal, such as a trigger signal or a transistor-transistor logic (TTL) signal, via a transfer cable to the processor system of each of the RF generators 1 through z. For example, the processor 106 sends a TTL signal 128 via the transfer cable 110 to the processor system of the RF generator 1, sends the TTL signal 128 via the transfer cable 112 to the processor system of the RF generator 2, and sends the TTL signal 128 via the transfer cable 114 to the processor system of the RF generator z. As an example, the TTL signal 128 is aperiodic. For example, the TTL signal 128 does not repeat over a predetermined time period. To illustrate, the TTL signal 128 is a single pulse that triggers execution of recipe sets of the recipe signals 120, 122, and 124 by the respective RF generators 1, 2, and z.

In response to receiving the TTL signal 128, the processor system of each RF generator 1 through z executes the recipe information received by the RF generator. For example, upon receiving the TTL signal 128, the processor system of the RF generator 1 executes the recipe information received within the recipe signal 120 to generate an RF signal 130 at the output O1. Also, upon receiving the TTL signal 128, the processor system of the RF generator 2 executes the recipe information received within the recipe signal 122 to generate an RF signal 132 at the output O2. Upon receiving the TTL signal 128, the processor system of the RF generator z executes the recipe information received within the recipe signal 124 to generate an RF signal 134 to the output Oz.

Each RF generator 1 through z includes an internal clock, such as a clock source or a clock oscillator or a clock circuit or a clock generator. The internal clock becomes inaccurate over time. For example, the internal clock becomes inaccurate due to malfunction of the internal clock or due to use of the internal clock over a long period of time. As a result of the inaccuracy, a pulse block of an RF signal is not generated by an RF generator according to recipe information received by the RF generator. Rather, the pulse block is delayed by one or more pulse periods.

The processor system of the RF generator 1 generates the synchronization signal 102 and sends the synchronization signal via a communication cable to each of the RF generators 2 through z. For example, the processor system of the RF generator 1 sends the synchronization signal 102 via the communication cable 116 to the processor system of the RF generator 2, and sends the synchronization signal 102 via the communication cable 118 to the processor system of the RF generator z. As such, the RF generator 1 acts as a master and the RF generators 2 through z act as slaves. Also, the processor system of the RF generator 1 control an RF power supply of the RF generator 1 to generate the RF signal 130 in synchronization with the synchronization signal 102.

The processor system of each RF generator 2 through z receives the synchronization signal 102 from the RF generator 1, and controls generation of pulse blocks of a corresponding one of the RF signals 132 and 134 based on pulses of the synchronization signal 102. As an example, the synchronization signal 102 includes timing information, which is sometimes referred to herein as information regarding the synchronization signal 102. To illustrate, the timing information includes a time at which a pulse block is to be generated by the RF generator 2 and a time at which a pulse block is to be generated by the RF generator z. As another illustration, the timing information further includes a time interval between two consecutive pulses of the synchronization signal 102. The time interval between the two consecutive pulses provides a frequency of generation of the pulses of the synchronization signal 102. To further illustrate, the timing information includes one or more times at which a logic level of the synchronization signal 102 is one and one or more time intervals for which a logic level of the synchronization signal 102 is not one, e.g., is zero. As an example, the processor system of the RF generator z receives the timing information embedded within the synchronization signal 102, such as a time at which a pulse block to be generated by the RF generator z.

Each RF generator 1 through z adjusts its time of generation or initiation of a pulse block based on the synchronization signal 102. For example, after receiving the synchronization signal 102, the RF generators 2 through z adjust their corresponding time of initiation of a pulse block. To illustrate, the RF generator 2 generates a pulse block at the same time at which a pulse of the synchronization signal 102 is received by the RF generator 2. In this illustration, the RF generator z generates a pulse block at the same time at which a pulse of the synchronization signal 102 is received by the RF generator 2. In this manner, the pulse blocks are generated by the RF generators 1 through z in a synchronized manner.

In one embodiment, the synchronization signal 102 is received by the processor system of each of the RF generators 2 through z from the RF generator 1 after receiving the TTL signal 128. In an embodiment, the synchronization signal 102 is received by the processor system of each of the RF generators 2 through z from the RF generator 1 simultaneously with reception of the TTL signal 128.

In an embodiment, a recipe signal is sometimes referred to herein as a recipe set.

Figure 1B:
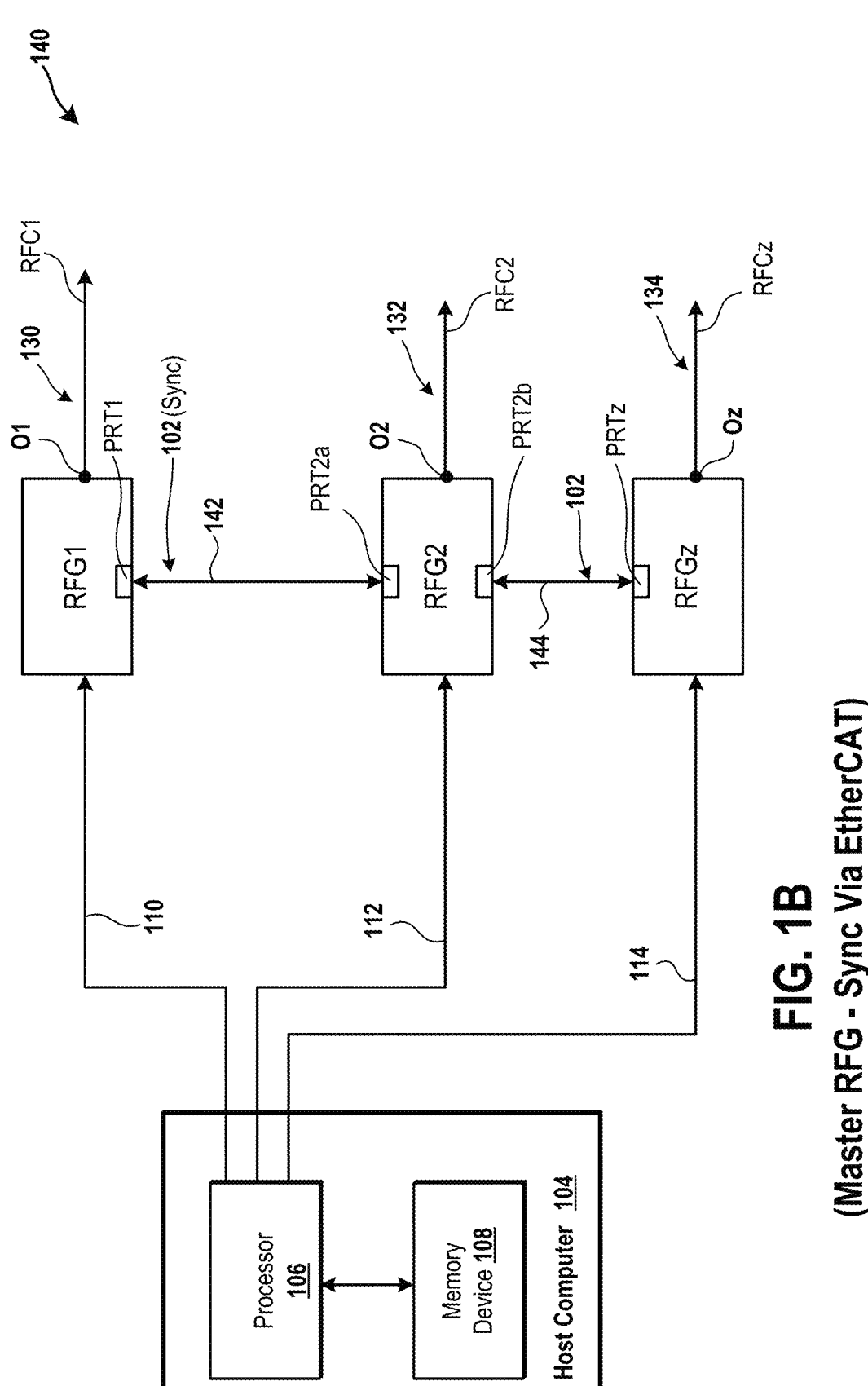
FIG. 1B is a diagram of an embodiment of a system to illustrate use of Ethernet for Control Automation System (EtherCAT) (ECAT) cables for sending the synchronization signal.

FIG. 1B is a diagram of an embodiment of a system 140 to illustrate use of Ethernet for Control Automation System (EtherCAT) (ECAT) cables for sending the synchronization signal 102. The system 140 includes the RF generators 1 through z, and the host computer 104. The RF generator 1 includes a communication port PRT1. Similarly, the RF generator 2 includes a communication port PRT2a and another port PRT2b. Also, the RF generator z includes a communication port PRTz. The port PRT1 is coupled to the port PRT2a via a communication cable 142 and the port PRT2b is coupled to the port PRTz via another communication cable 144. A communication cable used to transfer an ECAT train including one or more ECAT frames is sometimes referred to herein as an ECAT cable.

A digital signal processor (DSP) of the RF generator 1 receives the timing information for generating the pulse blocks of each of the RF generators 1 through z from the processor 106 via the transfer cable 110, and sends the timing information for generating the pulse blocks of each of the RF generators 2 through z to a communication controller of the RF generator 1. The communication controller of the RF generator 1 embeds the timing information for each of the RF generators 2 through z within one or more EtherCAT frames, and sends the one or more EtherCAT frames via the port PRT1 to the RF generator 2. For example, the communication controller of the RF generator 1 designates within the one or more EtherCAT frames the timing information for the RF generator 2, and designates within the one or more EtherCAT frames the timing information for the RF generator z. To illustrate, the communication controller of the RF generator 1 provides a first identifier to the timing information for the RF generator 1 and a second identifier to the timing information for the RF generator 2. To further illustrate, the designation or identification of the timing information for the RF generator 2 is different from or distinguished from the designation or identification of the timing information for the RF generator z. The port PRT1 sends the one or more EtherCAT frames via the communication cable 142 to the port PRT2*a* of the RF generator 2.

As used herein, an example of a controller includes a processor and a memory device. The processor is coupled to the memory device. Other examples of the controller include an ASIC and a PLD. Another example of the controller includes multiple processors and multiple memory devices. The processors are coupled to the memory devices.

A communication controller of the RF generator 2 receives the one or more EtherCAT frames via the port PRT2*a* and identifies the timing information designated for the RF generator 2 from the one or more EtherCAT frames. The communication controller of the RF generator 2 extracts, such as obtains, the timing information designated for the RF generator 2 from the one or more EtherCAT frames, and sends the timing information to the processor system of the RF generator 2 for execution. While the communication controller of the RF generator 2 extracts and sends the timing information to the processor system of the RF generator 2, the communication controller sends the one or more EtherCAT frames from the port PRT2*a* to the port PRT2*b* of the RF generator 2. The port PRT2*b* of the RF generator 2 receives the one or more EtherCAT frames from the port PRT2*a* and sends the one or more EtherCAT frames via the communication cable 144 to the port PRTz of the RF generator z.

A communication controller of the RF generator z receives the one or more EtherCAT frames at the port PRTz and identifies the timing information designated for the RF generator z from the one or more EtherCAT frames. The communication controller of the RF generator z extracts, such as obtains, the timing information designated for the RF generator z from the one or more EtherCAT frames, and sends the timing information to the processor system of the RF generator z for execution. While the communication controller of the RF generator z extracts and sends the timing information to the processor system of the RF generator 2, the communication controller sends the one or more EtherCAT frames from the port PRTz via the communication cable 144 to the port PRT2*b* of the RF generator 2. The communication controller of the RF generator 2 sends the one or more EtherCAT frames received of the port PRT2*b* to the port PRT2*a*, and further sends the one or more EtherCAT frames from the port PRT2*a* via the communication cable 142 back to the port PRT1 back to the RF generator 1.

The processor system of the RF generator 1 executes the timing information for the RF generator 1 to generate pulse blocks of the RF signal 130. Also, the processor system of the RF generator 2 executes the timing information for the RF generator 2 to generate pulse blocks of the RF signal 132 in synchronization with the generation of the pulse blocks of the RF signal 130. The processor system of the RF generator z executes the timing information for the RF generator z to generate pulse blocks of the RF signal 134 in synchronization with the generation of the pulse blocks of the RF signal 130. As such, the pulse blocks of the RF signals 130, 132, and 134 are generated in synchronization with each other to reduce any effects of the internal clocks of the RF generators 1 through z.

In one embodiment, the timing information for the RF generators 1 through z is the same. For example, the timing information for the RF generator 1 is the same as the timing information for the RF generator 2 and the timing information for the RF generator z. To illustrate, a pulse block is to be generated by the RF generator 1 at the same time at which a pulse block is to be generated by the RF generator 2 and at the same time at which a pulse block is to be generated by the RF generator z.

Figure 1C:
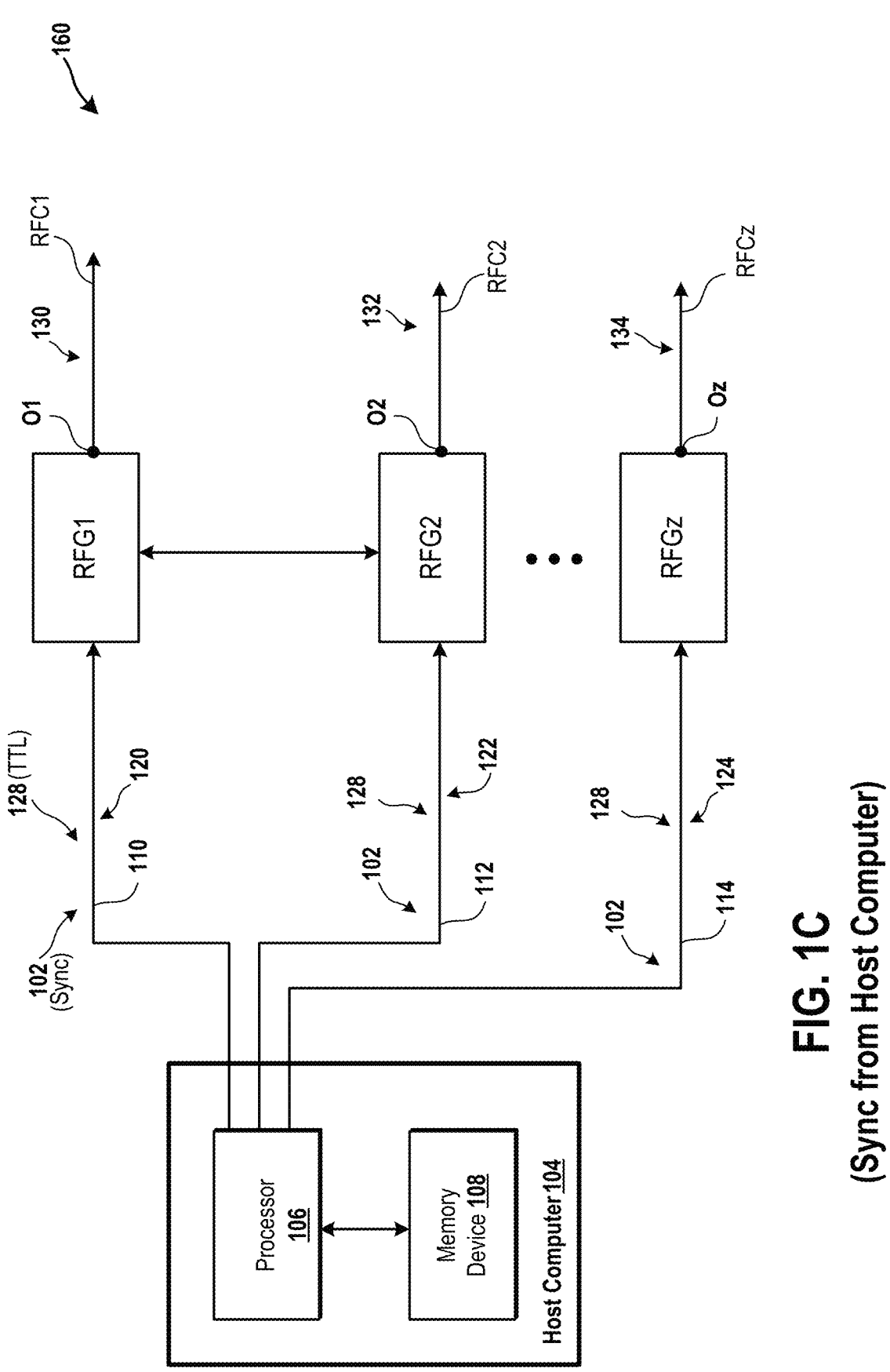
FIG. 1C is a diagram of an embodiment of a system with a processor that generates and sends the synchronization signal to the RF generators.

FIG. 1C is a diagram of an embodiment of a system 160 with the processor 106 that generates and sends the synchronization signal 102 to the RF generators 1 through z. The system 160 includes the host computer 104 and the RF generators 1 through z. The processor 106 sends the synchronization signal 102 via the transfer cable 110 to the RF generator 1. Similarly, the processor 106 sends the synchronization signal 102 via the transfer cable 112 to the RF generator 2 and via the transfer cable 114 to the RF generator z. As an example, the synchronization signal 102 is sent simultaneous with the TTL signal 228 or after the TTL signal 128 is sent to the RF generators 1 through z.

Upon receiving the synchronization signal 102, the RF generator 1 generates each pulse block of the RF signal 130 in synchronization with the synchronization signal 102. Similarly, in response to receiving the synchronization signal 102, the RF generator 2 generates each pulse block of the RF signal 132 in synchronization with the synchronization signal 102, and in response to receiving the synchronization signal 102, the RF generator z generates each pulse block of the RF signal 134 in synchronization with the synchronization signal 102. For example, a pulse block 2 of each of the RF signals 130, 132, and 134 is generated at the same time, a pulse block 3 of each of the RF signals 130, 132, and 134 is generated at the same time, and so on until a pulse block Mm of each of the RF signals 130, 132, and 134 is generated at the same time, where Mm is a positive integer. The integer Mm is determined from a time t0 at which the pulse blocks of the RF signals 130, 132, and 134 are generated.

Figure 2A:
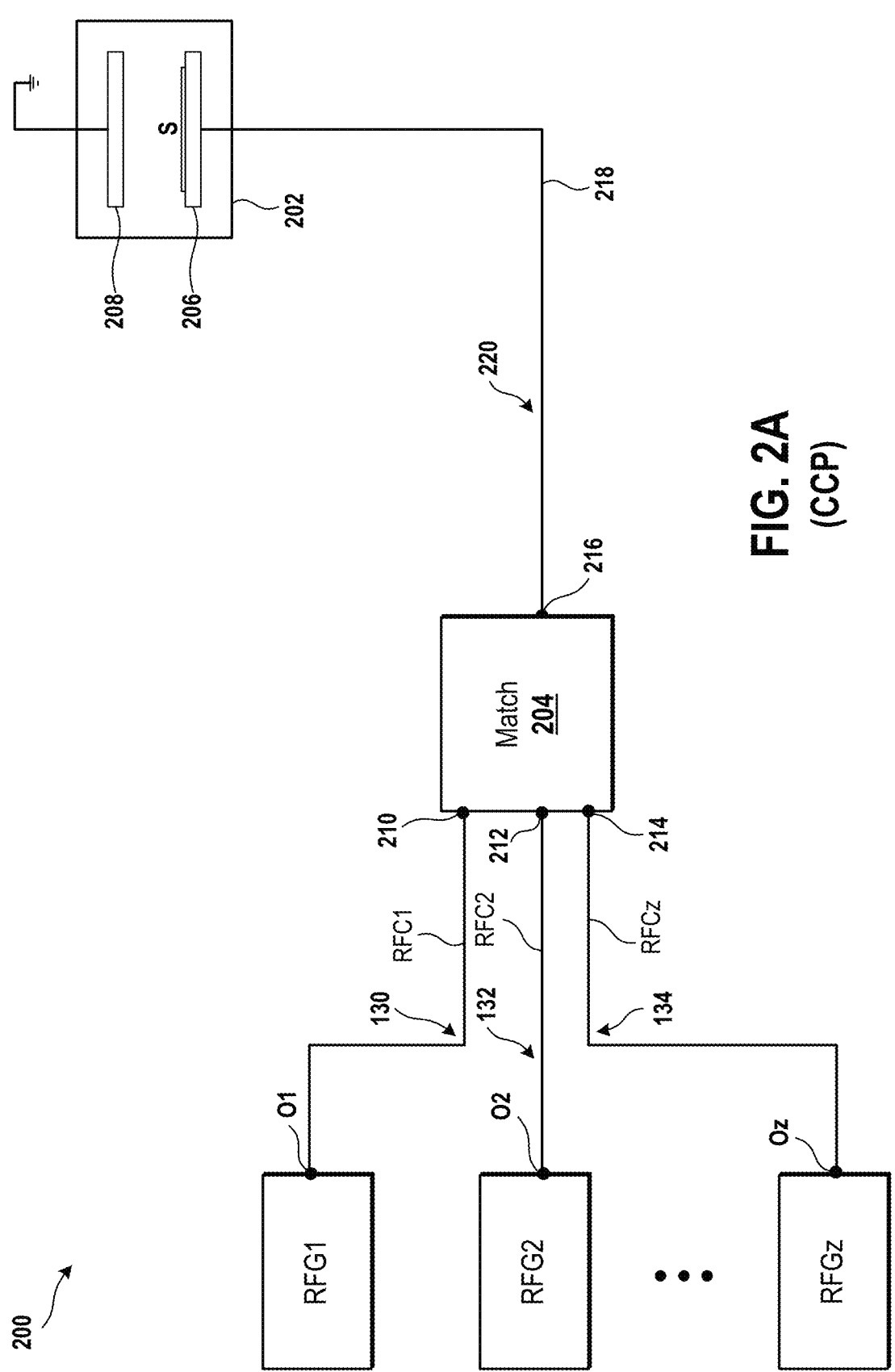
FIG. 2A is a diagram to illustrate use of the RF generators with a capacitively-coupled plasma chamber.

FIG. 2A is a diagram to illustrate use of the RF generators 1, 2, and z with a capacitively coupled plasma chamber 202. The system 200 includes the RF generators 1 through z, a match 204, and the plasma chamber 202.

The plasma chamber 202 includes a substrate support 206 and an upper electrode 208. Examples of the substrate support 206 include a chuck, such as an electrostatic chuck (ESC). To illustrate, the chuck includes a metal base and a dielectric layer on top of the metal base. A substrate S, such as a semiconductor wafer, is placed on a top surface of the substrate support 206 to be processed within the plasma chamber 202. The substrate support 206 includes a lower electrode, which is fabricated from a metal, such as aluminum or an alloy of aluminum. The lower electrode is embedded within the dielectric layer of the chuck.

The plasma chamber 202 further includes an upper electrode 208 that faces the top surface of the substrate support 206. A gap is formed between the upper electrode 208 and the substrate support 206.

The output O1 of the RF generator 1 is coupled via the RF cable RFC 1 to an input 210 of the match 204. Also, the output O2 of the RF generator 2 is coupled via the RF cable RFC 2 to another input 212 of the match 204 and the output Oz of the RF generator z is coupled via the RF cable RFC z to yet another input 214 of the match 204.

The input 210 of the match 204 is coupled via a first branch circuit of the match 204 to an output 216 of the match 204. Similarly, the input 212 of the match 204 is coupled via a second branch circuit of the match 204 to the output 216 and the input 214 of the match 204 is coupled via a third branch circuit of the match 204 to the output 216.

The output 216 is coupled via an RF transmission line 218 to the lower electrode of the substrate support 206. As an example, the RF transmission line 218 includes an RF rod, an insulator material, and an RF sheath. The insulator material is located between the RF rod and the RF sheath. The insulator material surrounds the RF rod and the RF sheath surrounds the insulator material. The RF transmission line 218 further includes one or more RF straps, and an RF cylinder. The RF rod is coupled to the output 216 of the match 204. The one or more RF straps coupled the RF rod to the RF cylinder, which is coupled to the lower electrode of the substrate support 206.

The RF generator 1 generates the RF signal 130 and sends the RF signal 130 via the output O1, the RF cable RFC 1, and the input 210 to the first branch circuit of the match 204. Similarly, the RF generator 2 generates the RF signal 132 and sends the RF signal 132 via the output O2, the RF cable RFC 2, and the input 212 to the second branch circuit of the match 204. Also, the RF generator z generates the RF signal 134 and sends the RF signal 134 via the output Oz, the RF cable RFC z, and the input 214 to the third branch circuit of the match 204.

The first branch circuit modifies an impedance of the RF signal 130 to output a first modified RF signal, the second branch circuit modifies an impedance of the RF signal 132 to output a second modified RF signal, and the third branch circuit modifies an impedance of the RF signal 134 to output a third modified RF signal. The first, second, and third modified RF signals are combined, such as added, at the output 216 by the match 204 to provide a combined RF signal 220. The combined RF signal 220 is transferred via the RF transmission line 218 to the lower electrode of the substrate support 206.

Moreover, one or more process gases, such as, an oxygen containing gas, and a fluorine containing gas, are supplied to the gap between the substrate support 206 and the upper electrode 208. When the one or more process gases and the combined RF signal 220 are supplied to gap within the plasma chamber 202, plasma is stricken or maintained within the plasma chamber 202, and the plasma is used to process the substrate S. Examples of processing the substrate S include depositing one or more materials on the substrate S, or etching the substrate S, or cleaning the substrate S, or polishing the substrate S, or sputtering the substrate S, or a combination thereof.

Figure 2B:
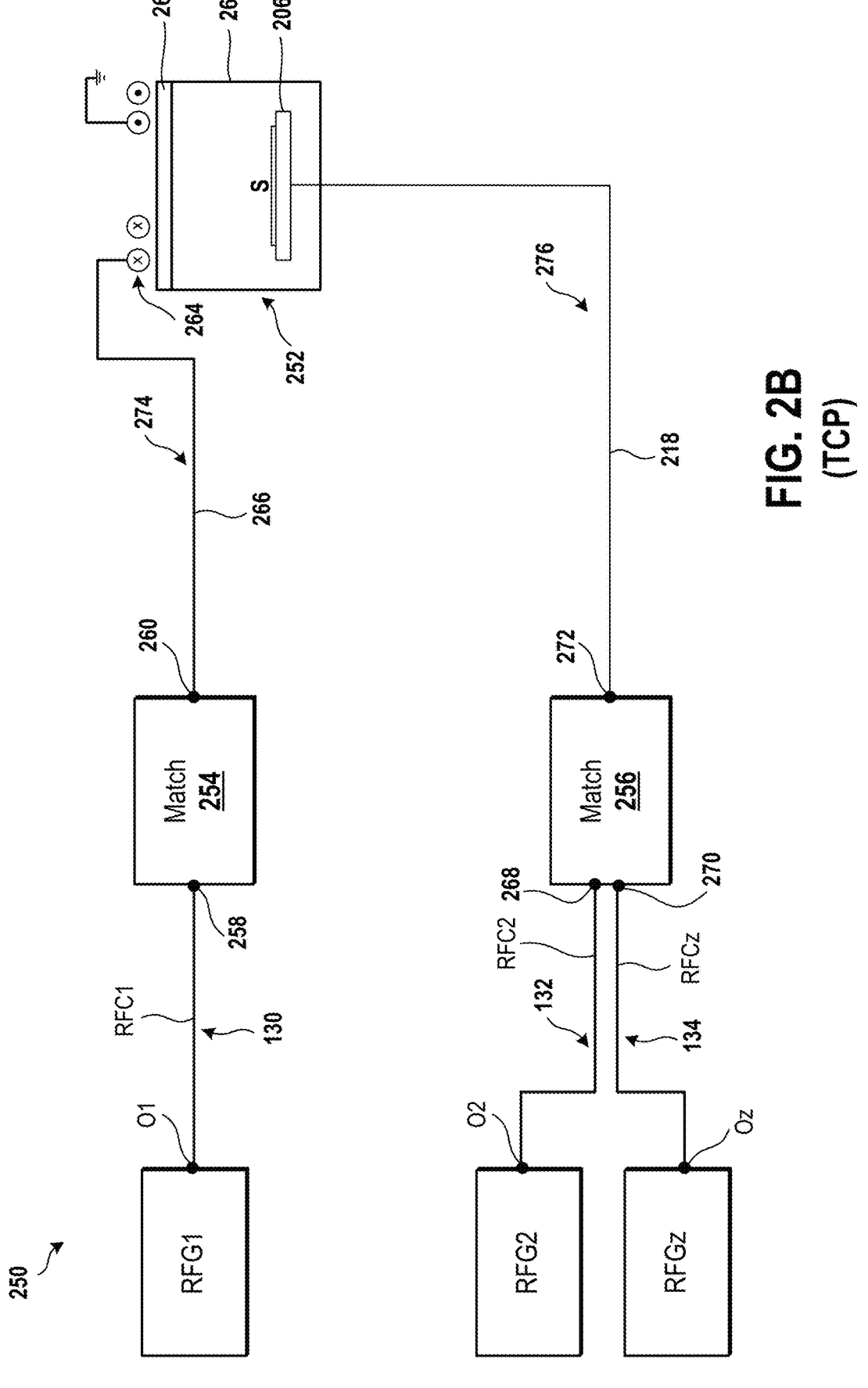
FIG. 2B is a diagram of an embodiment of a system to illustrate a transformer coupled plasma (TCP) chamber.

FIG. 2B is a diagram of an embodiment of a system 250 to illustrate a transformer coupled plasma (TCP) chamber 252. The system 250 includes the RF generators 1 through z, a match 254, and another match 256. The plasma chamber 252 includes a dielectric window 262 that is placed on top of a side wall 264. The plasma chamber 252 further includes a TCP coil 264 that is located over the dielectric window 262. The substrate support 206 lies within the plasma chamber 252.

The output O1 of the RF generator 1 is coupled via the RF cable RFC 1 to an input 258 of the match 254. An output 260 of the match 254 is coupled via an RF transmission line 266 to a first end of the TCP coil 264. As an example, the RF transmission line 266 includes an RF rod, an insulator material, and an RF sheath. The insulator material is located between the RF rod and the RF sheath. The insulator material surrounds the RF rod and the RF sheath surrounds the insulator material. An opposite second end of the TCP coil 264 is coupled to a ground potential.

The output O2 of the RF generator 2 is coupled via the RF cable RFC 2 to an input 268 of the match 272 and the output Oz of the RF generator z is coupled via the RF cable RFC z to another input 270 of the match 256. The input 268 is coupled via a first branch circuit of the match 256 to the output 272 and the input 270 is coupled via a second branch circuit of the match 256 to the output 272. The output 272 is coupled via the RF transmission line 218 to the lower electrode of the substrate support 206.

The RF generator 1 supplies the RF signal 130 at the output O1. The RF signal 130 is sent via the RF cable RFC 1 and the input 258 to the match 254. The match 254 matches an impedance of a load coupled to the output 260 with an impedance of a source coupled to the input 258 to output a modified RF signal 274 at the output 260. An example of the source coupled to the input 258 includes the RF cable RFC 1 and the RF generator 1. An example of the load coupled to the output 260 includes the RF transmission line 266 and the plasma chamber 252. The modified RF signal 274 is sent via the RF transmission line 266 to the TCP coil 264.

Also, the RF generator 2 supplies the RF signal 132 at the output O2. The RF signal 132 is supplied via the RF cable RFC 2 and the input 268 to the first branch circuit of the match 272. The first branch circuit matches an impedance of a load coupled to the output 272 with an impedance of a source coupled to the input 268 to output a first modified RF signal. An example of the source coupled to the input 268 includes the RF generator 2 and the RF cable RFC 2. An example of the load coupled to the output 272 includes the RF transmission line 218 and the plasma chamber 252. Similarly, the second branch circuit matches an impedance of the load coupled to the output 272 with an impedance of a source coupled to the input 270 to output a second modified RF signal. An example of the source coupled to the input 270 includes the RF generator z and the RF cable RFC z. The first and second modified RF signals are combined, such as added, at the output 272 of the match 256 to output a combined RF signal 276 at the output 272. The combined RF signal 276 is sent via the RF transmission line 218 to the lower electrode of the substrate support 206.

When the one or more process gases are supplied to a gap between the dielectric window 262 and the substrate support 206 within the plasma chamber 252, and the modified RF signal 274 and the combined RF signal 276 are supplied to the plasma chamber 252, the one or more process gases are ignited to strike plasma within the gap. The plasma is used to process the substrate S placed on the top surface of the substrate support 206.

FIG. 3A depicts a graph 300 to illustrate the TTL signal 128. The graph 300 plots a logic level of the TTL signal 128 versus time t. The logic level is plotted on a y-axis and the time t is plotted on an x-axis. The time t includes times t0, t1, t2, t3, t4, 15, 16, t7, 18, 19, t10, t11, t12, t13, t14, t16, t17, t18, 119, t20, t21, t22, t23, t24, t25, and t26.

A time interval between any two of the consecutive times t1 through t26 is the same. For example, a time interval between the times to and t1 is equal to a time interval between the times t1 and t2.

The TTL signal 128 has a logic level of 1 for a time interval between the time t0 and a time t0.5, and pulses from the logic level 1 to a logic level 0 at the time t0.5, which occurs half way between the times t0 and t1. For example, the time interval between the times t0 and t1 is divided into two equal time intervals at the time t0.5. The TTL signal 128 remains at the logic level 0 from the time t0.5.

In one embodiment, the TTL signal 128 transitions from the logic level 1 to the logic level 0 at a time other than the time t0.5. For example, the TTL signal 128 transitions from the logic 1 to the logic level 0 at the time t1 or at the time t2.

FIG. 3B is depicts a graph 302 to illustrate multiple pulse blocks 1, 2, and 3 of the RF signal 130 (FIG. 1A) that is generated by the RF generator 1. The graph 302 plots a variable, such as frequency or power, of the RF signal 130 versus the time t. The variable of the RF signal 130 is plotted on a y-axis and the time t is plotted on an x-axis.

Each pulse block of the RF signal 130 has N portions and N, as used herein, is a positive integer. The N portions of each pulse block of the RF signal 130 occur consecutively. For example, a second portion of the pulse block 1 of the RF signal 130 occurs next to a first portion of the pulse block 1 of the RF signal 130. There is no other portion between the first and second portions of the pulse block 1 of the RF signal 130.

The pulse block 1 starts at the time to and ends at the time t10. The first portion of the pulse block 1 occurs for a pulse period PP1, which is a time interval between the times t0 and t2. Similarly, the second portion of the pulse block 1 occurs for a pulse period PP2, which is a time interval between the times t2 and t4. An Nth portion of the pulse block 1 occurs for a pulse period PPN, which is a time interval between the times t8 and t10.

The pulse block 2 starts at the time t10 and ends at the time t20. A first portion of the pulse block 2 occurs for pulse period PP1, which is a time interval between the times t10 and t12. Similarly, a second portion of the pulse block 2 occurs for the pulse period PP2, which is a time interval between the times t12 and t14. An Nth portion of the pulse block 2 occurs for the pulse period PPN, which is a time interval between the times t18 and t20. Similarly, the pulse block 3 has portions 1 through N that occur over the pulse periods PP1 through PPN, and the pulse period PP1 starts at the time t20.

It should be noted that the pulse block 2 of an RF signal is consecutive to the pulse block 1 of the RF signal, and the pulse block 3 of the RF signal is consecutive to the pulse block 2 of the RF signal. There are no pulse blocks between the pulse blocks 1 and 2, and between the pulse blocks 2 and 3.

It should further be noted that as illustrated in FIG. 3B, the internal clock of the RF generator 1 does not have any errors in generating a clock signal or has a minimal amount of error, e.g., less than a pre-determined amount of error while generating the clock signal. It should be noted that an internal clock, described herein, has an error due to a malfunction of the internal clock or after a long period of use of the internal clock.

It should also be noted that each portion of each pulse block of the RF signal 130 has one or more variable levels between zero and a variable level of V1a. For example, the first portion of the pulse block 1 has an envelope that is between the variable level of zero and the variable level of V1a, and the Nth portion of the pulse block 1 has an envelope that is between the variable value of zero and the variable level of V1a. As an example, an envelope, as used herein, is a peak-to-peak magnitude or a zero-to-peak magnitude of an RF signal. As an example, a variable level includes one or more variable values.

In one embodiment, the pulse blocks of the graph 302 illustrate the RF signal 130 that is generated after the synchronization signal 102 is received by the RF generator 1 from the processor 106 (FIG. 1A). The pulse blocks of the RF signal 130 illustrated in the graph 302 are synchronized with the synchronization signal 102.

In an embodiment, the pulse blocks of the graph 302 illustrate the RF signal 130 that is generated after the synchronization signal 102 is generated by the RF generator 1. The pulse blocks of the RF signal 130 illustrated in the graph 302 are synchronized with the synchronization signal 102.

FIG. 3C is depicts a graph 304 to illustrate multiple pulse blocks (PBs) 1, 2, and 3 of the RF signal 132 (FIG. 1A) that is generated by the RF generator 2 when the RF generator 2 does not receive the synchronization signal 102. The graph 304 plots the variable of the RF signal 132 versus the time t. The variable of the RF signal 132 is plotted on a y-axis and the time t is plotted on an x-axis.

Each pulse block of the RF signal 132 has N portions. The N portions of each pulse block of the RF signal 132 occur consecutively. For example, a second portion of the pulse block 1 of the RF signal 132 occurs next to a first portion of the pulse block 1 of the RF signal 132. There is no other portion between the first and second portions of the pulse block 1 of the RF signal 132.

Due to an error in the internal clock of the RF generator 2, instead of starting at the time to, the pulse block 1 of the RF signal 132 starts at the time t2 instead of starting at the time to and ends at the time t12 instead of ending at the time t10. For example, the first portion of the pulse block 1 of the RF signal 132 occurs for the pulse period PP1, which is the time interval between the times t2 and t4, instead of occurring for the time interval between the times t0 and t2. Similarly, the second portion of the pulse block 1 of the RF signal 132 occurs for the pulse period PP2, which is the time interval between the times t4 and t6, instead of occurring for the time interval between the times t2 and t4. An (N−1)th portion of the pulse block 1 of the RF signal 132 occurs for a pulse period PP(N−1), which is a time interval between the times t8 and t10, instead of occurring for the time interval between the times t6 and t8. An Nth portion of the pulse block 1 of the RF signal 132 occurs for the pulse period PPN, which is the time interval between the times t10 and t12. Due to the error in the internal clock of the RF generator 2, the pulse period PPN occurs during the time interval between the times t10 and t12 instead of occurring during a time interval between the times t8 and t10. As such, the pulse block 1 of the RF signal 132 is delayed by a pulse period, and the delay is illustrated by oblique lines between the times to and t2.

Also, the pulse block 2 of the RF signal 132 generated by the RF generator 2 is delayed by a pulse period. The pulse block 2 of the RF signal 132 starts at the time t12 instead of starting at the time t10 and ends at the time t22 instead of ending at the time t20. For example, instead of a first portion of the pulse block 2 of the RF signal 132 occurring between the times t10 and t12, the first portion occurs between the times t12 and 14. Similarly, instead of an Nth portion of the pulse block 2 of the RF signal 132 occurring between the times t18 and t20, the Nth portion occurs between the times t20 and t22.

It should be noted that each portion of each pulse block of the RF signal 132 ranges from a variable level of zero to a variable level of V1$b$. For example, the first portion of the pulse block 1 has an envelope that ranges from a variable value of zero to a variable level of V1$b$ and the Nth portion of the pulse block 1 has an envelope that ranges from the variable value of zero to the variable level of V1$b$.

In one embodiment, the pulse block 1 of the RF signal 132 is delayed by any other number of pulse periods, such as by two or three pulse periods, from the time to.

In an embodiment, the pulse block 1 of the RF signal 132 is delayed by a fraction of the pulse period PP1. For example, the pulse block 1 of the RF signal 132 is delayed by three quarters of the pulse period PP1.

FIG. 3D depicts a graph 306 to illustrate multiple pulse blocks 1, 2, and 3 of the RF signal 134 (FIG. 1A) that is generated by the RF generator z when the RF generator z does not receive the synchronization signal 102. The graph 306 plots the variable of the RF signal 134 versus the time t. The variable of the RF signal 134 is plotted on a y-axis and the time t is plotted on an x-axis.

Each pulse block of the RF signal 134 has N portions. The N portions of each pulse block of the RF signal 134 occur consecutively. For example, a second portion of the pulse block 1 of the RF signal 134 occurs next to a first portion of the pulse block 1 of the RF signal 134. There is no other portion between the first and second portions of the pulse block 1 of the RF signal 134.

Due to an error in the internal clock of the RF generator z, instead of starting at the time to, the pulse block 1 of the RF signal 134 starts at the time t4 and ends at the time t14 instead of ending at the time t12. For example, the first portion of the pulse block 1 of the RF signal 134 occurs for the pulse period PP1, which is the time interval between the times t4 and t6, instead of occurring during the time interval between the times to and t2. Similarly, the second portion of the pulse block 1 of the RF signal 134 occurs for the pulse period PP2, which is the time interval between the times t6 and t8, instead of occurring during the time interval between the times t2 and t4. An (N−2)th portion of the pulse block 1 of the RF signal 134 occurs for a pulse period PP(N−2), which is the time interval between the times t8 and t10, instead of occurring during the time interval between the times t4 and t6. An (N−1)th portion of the pulse block 1 of the RF signal 134 occurs for a pulse period PP(N−1), which is a time interval between the times t10 and t12, instead of occurring during the time interval between the times t6 and t8. An Nth portion of the pulse block 1 of the RF signal 134 occurs for the pulse period PPN, which is the time interval between the times t12 and t14. Due to the error in the internal clock of the RF generator z, the pulse period PPN occurs during the time interval between the times t12 and t14 instead of occurring during a time interval between the times t8 and t10. As such, the pulse block 1 of the RF signal 134 is delayed by two pulse periods, and the delay is illustrated by oblique lines between the times 10 and t4.

Also, the pulse block 2 of the RF signal 134 is delayed by two pulse periods. The pulse block 2 of the RF signal 134 starts at the time t14 instead of starting at the time t10 and ends at the time t24 instead of ending at the time t20. For example, instead of a first portion of the pulse block 2 of the RF signal 134 occurring between the times t10 and t12, the first portion occurs between the times t14 and 16. Similarly, instead of an Nth portion of the pulse block 2 of the RF signal 134 occurring between the times t18 and t20, the Nth portion occurs between the times t22 and t24.

It should be noted that each portion of each pulse block of the RF signal 134 ranges from a variable level of zero to a variable level of V1$c$. For example, the first portion of the pulse block 1 has an envelope that ranges from a variable value of zero to a variable level of V1$c$ and the Nth portion of the pulse block 1 has an envelope that ranges from the variable value of zero to the variable level of V1$c$.

In one embodiment, the pulse block 1 of the RF signal 134 is delayed by any other number of pulse periods, such as by one or three or four pulse periods, from the time t0.

In an embodiment, the pulse block 1 of the RF signal 134 is delayed by a fraction of the pulse period PP1. For example, the pulse block 1 of the RF signal 134 is delayed by half or three quarters of the pulse period PP1.

FIG. 3E depicts a graph 308 to illustrate forward (FWD) power of the RF signal 130 that is supplied by the RF generator 1 of the system 250 (FIG. 2B). The graph 308 plots the forward power versus the time t. There is no error, in the forward power, created by the internal clock of the RF generator 1. There is no delay in the supply of the forward power by the RF generator 1 from the time to at which the TTL signal 128 is received by the RF generators 1, 2 and z from the processor 106. A pulse block 1 of the forward power supplied by the RF generator 1 starts at the time to. After the pulse block 1 of the forward power ends, another pulse block 2 of the forward power starts.

FIG. 3F depicts a graph 310 to illustrate reverse (REV) power, such as reflected power, that is received by the RF generator 1 of the system 250 (FIG. 2B). For example, the reflected power is reflected from the plasma chamber 252 via the RF transmission line 266, the output 260 of the match 254, the match 254, the input 258 of the match 254, and the RF cable RFC 1 to the output O1 of the RF generator 1. The graph 310 plots the reverse power versus the time t. There is no error, in the reverse power, created by the internal clock of the RF generator 1. There is no delay in the reverse power received by the RF generator 1. The delay in the reverse power is measured from the time to at which the TTL signal 128 is received by the RF generators 1, 2 and z from the processor 106. A pulse block 1 of the reverse power received by the RF generator 1 starts at the time to. After the pulse block 1 of the reverse power ends, another pulse block 2 of the reverse power starts.

FIG. 3G depicts a graph 312 to illustrate forward power of the RF signal 132 that is supplied by the RF generator 2 of the system 250 (FIG. 2B). The graph 312 plots the forward power versus the time t. There is an error, in the forward power, created by the internal clock of the RF generator 2. There is a delay in the supply of the forward power by the RF generator 2. As an example, the delay in the supply of the forward power is two pulse periods (PP×2). A pulse block 2 of the forward power supplied by the RF generator 2 starts at a time that is delayed by two pulse periods from a time at which a pulse block 1 of the forward power supplied by the RF generator 1 of the system 250 ends.

FIG. 3F depicts a graph 314 to illustrate reverse power, such as reflected power, that is received by the RF generator 2 of the system 250 (FIG. 2B). The reflected power is reflected from the plasma chamber 252 via the RF transmission line 218, the output 272 of the match 256, the match 256, the first branch circuit of the match 256, the input 268 of the match 256, and the RF cable RFC 2 to the output O2 of the RF generator 2. The graph 314 plots the reverse power versus the time t. Due to the error in the internal clock of the RF generator 2, there is a delay in the reverse power received by the RF generator 2. As an example, the delay in the receipt of the reverse power by the RF generator 2 is two pulse periods (PP×2). A pulse block 2 of the reverse power received by the RF generator 2 starts at a time that is delayed by two pulse periods from a time at which the pulse block 1 of the reverse power received by the RF generator 1 of the system 250 ends.

Figures 4A, 4B:
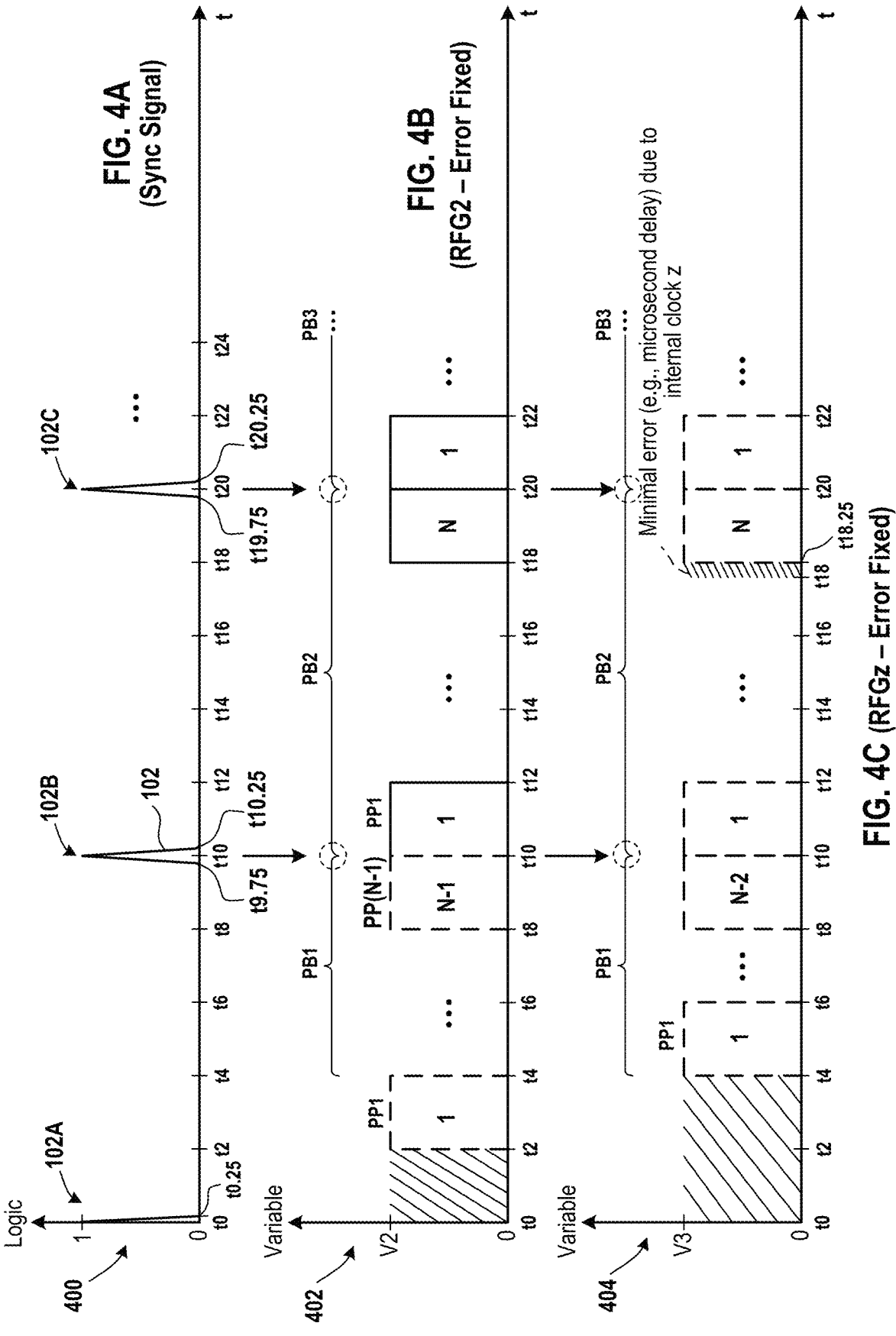
FIG. 4A depicts a graph to illustrate the synchronization signal.
FIG. 4B depicts a graph to illustrate that a delay in multiple pulse blocks of an RF signal generated by an RF generator is reduced by the synchronization signal.

FIG. 4A is depicts a graph 400 to illustrate the synchronization signal 102, which is a periodic signal. The graph 400 plots a logic level of the synchronization signal 102 versus the time t. The synchronization signal 102 has multiple pulses at periodic time intervals. For example, the synchronization signal 102 has a pulse 102A, another pulse 102B, and yet another pulse 102C.

The logic level of the synchronization signal 102 is plotted on a y-axis and the time t is plotted on an x-axis. At the time to, the synchronization signal 102 is at the logic level 1. The synchronization signal 102 pulses from the logic level 1 back to the logic level 0 and reaches the logic level 0 at a time t0.25 to create the pulse 102A. The time 0.25 occurs at a quarter of the time interval between the times t0 and t1. The synchronization signal 102 remains at the logic level 0 from the time t0.25 to a time t9.75. The time t9.75 occurs at three quarters of a time interval between the times t9 and t10.

The synchronization signal 102 transitions from the logic level 0 to the logic level 1 at the time t9.75. The synchronization signal 102 is at the logic level 1 at the time t10 and starts transitioning from the logic level 1 to the logic level 0 at the time t10. The synchronization signal 102 reaches the logic level 0 at a time t10.25, which is a quarter of a time interval between the times t10 and t10.25, to create the pulse 102B. The synchronization signal 102 remains at the logic level 0 from the time t10.25 to a time t19.75. The time t19.75 occurs at three quarters of a time interval between the times t19 and t20.

The synchronization signal 102 transitions from the logic level 0 to the logic level 1 at the time t19.75. The synchronization signal 102 reaches the logic level 1 at the time t20 and starts transitioning at the time t20 from the logic level 1 to the logic level 0. The synchronization signal 102 reaches the logic level 0 at a time t20.25 to create the pulse 102C. The time t20.25 occurs at a quarter of a time interval between the times t20 and t21.

In one embodiment, instead of being a triangular-shaped pulse, the synchronization signal 102 is a rectangular-shaped pulse. For example, the synchronization signal 102 pulses from the logic level 0 to the logic level 1 at the time t10, remains at the logic level 1 from the time t10 and the time t11, and pulses from the logic level 1 to the logic level 0 at the time t11.

FIG. 4B depicts a graph 402 to illustrate that the delay in the pulse blocks of the RF signal 132 generated by the RF generator 2 (FIG. 1A) is fixed, such as reduced or deleted or minimized or corrected, by the synchronization signal 102. The synchronization signal 102 is received by the RF generator 2. The graph 402 plots the pulse blocks of the RF signal 132 versus the time t. The pulse block 1 of the RF signal 132 is delayed by one pulse period. However, when the synchronization signal 102 pulses from the logic level 0 to achieve the logic level 1 at the time t10, the (N−1)th portion of the pulse block 1 of the RF signal 132 ends at the time t10 and the pulse block 1 ends at the (N−1)th portion at the time t10.

When the synchronization signal 102 pulses from the logic level 0 to achieve the logic level 1 at the time t10, the RF generator 2 does not generate the Nth portion of the pulse block 1. For example, the RF generator 2 avoids generating the Nth portion of the pulse block 1 of the RF signal 132 at the time t10. Rather, the RF generator 2 generates the pulse block 2 at the time t10. For example, the RF generator 2 generates the first portion of the pulse block 2 at the time t10 instead of generating the Nth portion of the pulse block 1 at the time t10. By generating the first portion of the pulse block 2 at the time t10, the pulse block 2 is synchronized by the RF generator 2 with the pulse of the synchronization signal 102, which is generated at the time t10 and received, by the RF generator 2, at the time t10.

It should be noted that there is no need to synchronize the pulse block 2 generated by the RF generator 1. There is none or minimal error created by the internal clock of the RF generator 1 in the pulse blocks of the RF signal 130. Without the error or with the minimal error, the pulse block 2 of the RF signal 130 generated by the RF generator 1 is synchronized with the pulse of the synchronization signal 102 generated at the time t10.

By generating the first portion of the pulse block 2 of the RF signal 132 at the time t10, the Nth portion of the pulse block 2 is generated at the time t18 and there is a good chance that the Nth portion of the pulse block 2 ends at the time t20. In this manner, the Nth portion of the pulse block 2 of the RF signal 132 is not delayed by one pulse period.

The pulse 102C of the synchronization signal 102 achieves the logic level 1 at the time t20. In case there is a delay in the pulse block 2 of the RF signal 132 due to the internal clock of the RF generator 2, the delay is fixed, such as minimized or reduced or canceled or deleted, by the pulse 102C at the time t20 of the synchronization signal 102. At the time t20 at which the pulse 102C of the synchronization signal 120 is generated, the pulse block 2 of the RF signal 132 ends and the pulse block 3 of the RF signal 132 starts. The pulse block 3 is not delayed by one pulse period. Rather, the pulse block 3 of the RF signal 132 starts at the time t20.

FIG. 4C depicts a graph 404 to illustrate that the delay in the pulse blocks of the RF signal 134 generated by the RF generator z (FIG. 1A) is fixed, such as reduced or deleted or minimized, by the synchronization signal 102. The synchronization signal 102 is received by the RF generator z. The graph 404 plots the pulse blocks of the RF signal 134 versus the time t. The pulse block 1 of the RF signal 134 is delayed by two pulse periods. However, when the synchronization signal 102 pulses from the logic level 0 to achieve the logic level 1 at the time t10, the (N−2)th portion of the pulse block 1 of the RF signal 134 ends at the time t10 and the pulse block 1 ends at the (N−2)th portion at the time t10.

When the synchronization signal 102 pulses from the logic level 0 to achieve the logic level 1 at the time t10, the RF generator z does not generate the remaining portions, such as the (N−1)th and Nth portions of the pulse block 1. For example, the RF generator z avoids generating the (N−1)th portion of the pulse block 1 of the RF signal 134 at the time t10 and avoids generating the Nth portion of the pulse block 1 of the RF signal 134 at the time t12. Rather, the RF generator z generates the pulse block 2 of the RF signal 134 at the time t10. For example, the RF generator z generates the first portion of the pulse block 2 at the time t10 instead of generating the (N−1)th portion of the pulse block 1 at the time t10. By generating the first portion of the pulse block 2 at the time t10, the pulse block 2 is synchronized by the RF generator z with the pulse of the synchronization signal 102, which is generated at the time t10 and received, by the RF generator z, at the time t10.

By generating the first portion of the pulse block 2 at the time t10, the Nth portion of the pulse block 2 of the RF signal 134 is generated at the time t18 and there is a good chance that the Nth portion of the pulse block 2 of the RF signal 134 ends at the time t20. In this manner, the Nth portion of the pulse block 2 of the RF signal 134 is not delayed by two pulse periods.

Another pulse of the synchronization signal 102 achieves the logic level 1 at the time t20 to create the pulse. In case there is a delay in the pulse block 2 of the RF signal 134 due to the internal clock of the RF generator 2, the internal error is fixed, such as minimized or reduced or canceled or deleted, by the pulse of the synchronization signal 102 at the time t20. The minimal error is illustrated using oblique lines between the time t18 and a time t18.25, which occurs at a quarter of the time interval between the times t18 and t19. At the time t20 at which the pulse of the synchronization signal 120 is generated, the pulse block 2 of the RF signal 134 ends and the pulse block 3 of the RF signal 134 starts. The pulse block 3 is not delayed by two pulse periods. Rather, the pulse block 3 of the RF signal 134 starts at the time t20.

The synchronization signal 102 synchronizes the pulse blocks 2 and 3 of each of the RF signals 130, 132 and 134. In case there is a delay in a pulse block of any of the RF signals 130, 132, and 134, the error is fixed by the synchronization signal 102. As such, the pulse blocks 1 through 3 of the RF signals 130, 132, and 134 are synchronized. For example, the pulse block 1 of each of the RF signals 130, 132, and 134 start at the same time. Similarly, the pulse block N of each of the RF signals 130, 132, and 134 starts at the same time.

FIG. 5A depicts a graph 502 to illustrate each pulse block of the RF signal 130. The graph 502 plots a variable level of each pulse block of the RF signal 130 versus the time t. The first portion of the pulse block 1 of the RF signal 130 includes four states S1, S2, S3, and S4. Each portion of the pulse block 1 of the RF signal 130 includes the four states S1, S2, S3, and S4.

Each state of a variable of the pulse block 1 of the RF signal 130 corresponds to a variable level of the variable. For example, the state S4 of the variable of the RF signal 130 has the variable level V1*a*, the state S3 of the variable of the RF signal 130 has a variable level V0.8*a*, the state S2 of the variable of the RF signal 130 has a variable level V0.6*a*, and the state S1 of the variable of the RF signal 130 has a variable level V0.2*a*. The variable level V0.2*a* is greater than zero. Also, the variable level V0.6*a* is greater than the variable level V0.2*a*. The variable level V0.8*a* is greater than the variable level V0.6*a* and the variable level V1*a* is greater than the variable level V0.8*a*.

It should be noted that a first variable level of the variable is different from, such as exclusive from, a second variable level of the variable. For example, values of the variable level V0.8*a* exclude values of the variable level V0.6*a*. To illustrate, the variable level V0.8*a* has one or more values and a minimum of the one or more values is greater than a maximum of one or more values of the variable level V0.6*a*.

During the pulse period PP1, at the time to, the first portion of the pulse block 1 of the RF signal 130 transitions from the variable level V0.2*a* to the variable level V1*a*. The first portion of the pulse block 1 of the RF signal 130 is at the variable level V1*a* from the time t0 to a time t0.5. The time t0.5 is at half of the time interval between the times t0 and t1. Further, during the pulse period PP1, at the time t0.5, the first portion of the pulse block 1 of the RF signal 130 transitions from the variable level V1*a* to the variable level V0.8*a*. The first portion of the pulse block 1 of the RF signal 130 is at the variable level V0.8*a* from the time t0.5 to the time t1.

Also, during the pulse period PP1, at the time t1, the first portion of the pulse block 1 of the RF signal 130 transitions from the variable level V0.8*a* to the variable level V0.6*a*. The first portion of the pulse block 1 of the RF signal 130 is at the variable level V0.6*a* from the time t1 to a time t1.5. The time t1.5 is at half of the time interval between the times t1 and t2. During the pulse period PP1, at the time t1.5, the first portion of the pulse block 1 of the RF signal 130 transitions from the variable level V0.6*a* to the variable level V0.2*a*. The first portion of the pulse block 1 of the RF signal 130 is at the variable level V0.2*a* from the time t1.5 to the time t2. The first portion of the pulse block 1 of the RF signal 130 transitions at the time t2 to the variable level V1.

The states S1 through S4 of the variable of the RF signal 130 repeat for each portion of the pulse block 1 of the RF signal 130 until the Nth portion of the pulse block 1 of the RF signal 130 occurs. The Nth portion of the pulse block 1 of the RF signal 130 occurs during the pulse period PPN of the pulse block 1 and the Nth portion includes the four states S1 through S4. For example, the states S1 through S4 repeat during the pulse period PP2 of the pulse block 1 of the RF signal 130 and repeat again during the pulse period PP3 of the pulse block 1 and so on until the pulse period PPN of the pulse block 1. The pulse block 1 of the RF signal 130 ends at the time t10.

The pulse block 2 of the RF signal 130 is consecutive to the pulse block 1 of the RF signal 130. The pulse block 2 of the RF signal 130 includes N portions. The first portion of the pulse block 2 of the RF signal 130 includes three states S1, S2, and S3. Each portion of the pulse block 2 of the RF signal 130 includes the three states S1, S2, and S3.

Each state of a variable of the pulse block 2 of the RF signal 130 corresponds to a variable level of the variable. For example, the state S3 of the variable of the pulse block 2 of the RF signal 130 has the variable level V1*a*, the state S2 of the variable of the pulse block 2 of the RF signal 130 has the variable level V0.6*a*, and the state S1 of the variable of the pulse block 2 of the RF signal 130 has the variable level V0.4*a*.

During the pulse period PP1, at the time t10, the first portion of the pulse block 2 of the RF signal 130 transitions from the variable level V0.2*a* to the variable level V1*a*. The first portion of the pulse block 2 of the RF signal 130 is at the variable level V1*a* from the time t10 to a time t10.5. The time t10.5 is at half of the time interval between the times t10 and t11. Further, during the pulse period PP1, at the time t10.5, the first portion of the pulse block 2 of the RF signal 130 transitions from the variable level V1*a* to the variable level V0.6*a*. The first portion of the pulse block 2 of the RF signal 130 is at the variable level V0.6*a* from the time t10.5 to the time t11.

Also, during the pulse period PP1, at the time t11, the first portion of the pulse block 2 of the RF signal 130 transitions from the variable level V0.6*a* to the variable level V0.4*a*. The first portion of the pulse block 2 of the RF signal 130 is at the variable level V0.4*a* from the time t11 to the time t12. The first portion of the pulse block 2 of the RF signal 130 transitions from the variable level V0.4*a* to the variable level V1*a* at the time t12.

The states S1 through S3 of the variable of the RF signal 130 repeat for each pulse period of the pulse block 2 until the pulse period PPN of the pulse block 2. For example, the states S1 through S3 repeat during the pulse period PP2 of the pulse block 2 and repeat again during the pulse period PP3 of the pulse block 2 and so on until the pulse period PPN of the pulse block 2.

In one embodiment, the pulse block 1 of the RF signal 130 includes any other number of states. For example, the pulse block 1 includes two states or five states or ten states.

In an embodiment, the pulse block 2 of the RF signal 130 includes any other number of states. For example, the pulse block 2 includes two states or five states or ten states or twenty states.

In one embodiment, a number of pulse periods for a first pulse block of an RF signal is different than a number of pulse periods for a second pulse block of the RF signal. For example, the pulse block 1 of the RF signal 130 has N portions and the pulse block 2 has (N–1) portions. To illustrate, the pulse block 1 of the RF signal 130 has 4 portions and the pulse block 2 of the RF signal 130 has 6 portions.

FIG. 5B depicts a graph 504 to illustrate each pulse block of the RF signal 132. The graph 504 plots a variable level of each pulse block of the RF signal 132 versus the time t. The first portion of the pulse block 1 of the RF signal 132 includes three states S1, S2, and S3.

Each state of a variable of the pulse block 1 of the RF signal 132 corresponds to a variable level of the variable. For example, the state S2 of the variable of the RF signal 132 has a variable level V0.5$b$, the state S3 of the variable of the RF signal 132 has the variable level V1$b$, and the state S1 of the variable of the RF signal 130 has a variable level V0.25$b$. The variable level V0.25$b$ is greater than the variable level zero. The variable level V0.5$b$ is greater than the variable level V0.25$b$ and the variable level V1$b$ is greater than variable level V0.5$b$.

It should be noted that a first variable level of the variable is different from, such as exclusive from, a second variable level of the variable. For example, values of the variable level V1$b$ exclude values of the variable level V0.5$b$. To illustrate, the variable level V1$b$ has one or more values and a minimum of the one or more values is greater than a maximum of one or more values of the variable level V0.5$b$.

As a result of the error created by the internal clock of the RF generator 2, generation of the variable of the RF signal 132 is delayed by one pulse period. For example, instead of the state S2 of the variable of the RF signal 132 starting at the time to, the state S2 starts at the time t2.

During the pulse period PP1, at the time t2, the first portion of the pulse block 1 of the RF signal 132 transitions from the variable level V0.25$b$ to the variable level V0.5$b$. The first portion of the pulse block 1 of the RF signal 132 is at the variable level V0.5$b$ from the time t2 to the time t3. Further, during the pulse period PP1, at the time t3, the first portion of the pulse block 1 of the RF signal 132 transitions from the variable level V0.5$b$ to the variable level V1$b$. The first portion of the pulse block 1 of the RF signal 132 is at the variable level V1$b$ from the time t3 to a time t3.5. The time t3.5 occurs at half of the time interval between the times t3 and t4.

Also, during the pulse period PP1, at the time t3.5, the first portion of the pulse block 1 of the RF signal 132 transitions from the variable level V1$b$ to the variable level V0.25$b$. The first portion of the pulse block 1 of the RF signal 132 is at the variable level V0.25$b$ from the time t3.5 to the time t4. At the time t4, the first portion of the pulse block 1 of the RF signal 132 transitions from the variable level V0.25$b$ to the variable level V0.5$b$.

The states S1 through S3 of the variable of the RF signal 132 repeat for each portion of the pulse block 1 of the RF signal 132 until the Nth portion of the pulse block 1 of the RF signal 132 occurs. Each portion of the pulse block 1 of the RF signal 132 has the states S1 through S3. The Nth portion of the pulse block 1 of the RF signal 132 occurs during the pulse period PPN of the pulse block 1 and the Nth portion includes the three states S1 through S3. For example, the states S1 through S3 repeat during the pulse period PP2 of the pulse block 1 of the RF signal 132 and repeat again during the pulse period PP3 of the pulse block 1 and so on until the pulse period PPN of the pulse block 1. The pulse block 1 of the RF signal 132 ends at the time t12 instead of the time t10 due to the error created by the internal clock of the RF generator 2.

The pulse block 2 of the RF signal 132 is consecutive to the pulse block 1 of the RF signal 132. The pulse block 2 of the RF signal 132 includes N portions. The first portion of the pulse block 2 of the RF signal 132 includes two states S1 and S2. Each portion of the pulse block 2 of the RF signal 132 has the states S1 and S2.

Each state of a variable of the pulse block 2 of the RF signal 132 corresponds to a variable level of the variable. For example, the state S1 of the variable of the RF signal 132 has the variable level V0.5$b$ and the state S2 of the variable of the RF signal 132 has the variable level V1$b$.

During the pulse period PP1, at the time t12, the first portion of the pulse block 2 of the RF signal 132 transitions from the variable level V0.25$b$ to the variable level V0.5$b$. The first portion of the pulse block 2 of the RF signal 132 is at the variable level V0.5$b$ from the time t12 to the time t13. Further, during the pulse period PP1, at the time t13, the first portion of the pulse block 2 of the RF signal 132 transitions from the variable level V0.5$b$ to the variable level V1$b$. The first portion of the pulse block 2 of the RF signal 132 is at the variable level V1$b$ from the time t13 to the time t14. At the time t14, the first portion of the pulse block 2 of the RF signal 132 transitions from the variable level V1$b$ to the variable level V0.5$b$.

The states S1 and S2 of the variable of the RF signal 132 repeat until the pulse period PPN of the pulse block 2. For example, the states S1 and S2 repeat during the pulse period PP2 of the pulse block 2 and repeat again during the pulse period PP3 of the pulse block 2 and so on until the pulse period PPN of the pulse block 2.

In one embodiment, the pulse block 1 of the RF signal 132 includes any other number of states. For example, the pulse block 1 includes four states or ten states.

In an embodiment, the pulse block 2 of the RF signal 132 includes any other number of states. For example, the pulse block 2 includes four states or five states or ten states or twenty states.

FIG. 5C depicts a graph 506 to illustrate each pulse block of the RF signal 134. The graph 506 plots a variable level of each pulse block of the RF signal 134 versus the time t. The first portion of the pulse block 1 of the RF signal 134 includes two states S1 and S2. Each portion of the pulse block 1 of the RF signal 134 has the states S1 and S2.

Each state of a variable of the pulse block 1 of the RF signal 134 corresponds to a variable level of the variable. For example, the state S2 of the variable of the RF signal 134 has a variable level V1$c$ and the state S1 of the variable of the RF signal 134 has a variable level V0.33$c$. The variable level V0.33$c$ is greater than the variable level zero. The variable level V1$c$ is greater than the variable level V0.33$c$.

It should be noted that a first variable level of the variable is different from, such as exclusive from, a second variable level of the variable. For example, values of the variable level V1$c$ exclude values of the variable level V0.33$c$. To illustrate, the variable level V1$c$ has one or more values and a minimum of the one or more values is greater than a maximum of one or more values of the variable level V0.33$c$.

As a result of the error created by the internal clock of the RF generator z, generation of the variable of the RF signal 134 is delayed by two pulse periods. For example, instead of the state S2 of the variable of the pulse block 1 of the RF signal 134 starting at the time to, the state S2 starts at the time t4.

During the pulse period PP1, at the time t4, the first portion of the pulse block 1 of the RF signal 134 transitions from the variable level V0.33$c$ to the variable level V1$c$. The first portion of the pulse block 1 of the RF signal 134 is at the variable level V1$c$ from the time t4 to the time t5. Further, during the pulse period PP1, at the time t5, the first portion of the pulse block 1 of the RF signal 134 transitions from the variable level V1$c$ to the variable level V0.33$c$. The first portion of the pulse block 1 of the RF signal 134 is at the variable level V0.33$c$ from the time t5 to the time t6. At the time t6, the first portion of the pulse block 1 of the RF signal 134 transitions from the variable level V0.33$c$ to the variable level V1$c$.

The states S1 and S2 of the variable of the RF signal 134 repeat to form each portion of the pulse block 1 of the RF signal 134 until the Nth portion of the pulse block 1 of the RF signal 134 is formed. The Nth portion of the pulse block 1 of the RF signal 134 occurs during the pulse period PPN of the pulse block 1 and the Nth portion includes the two states S1 and S2. For example, the states S1 and S2 repeat during the pulse period PP2 of the pulse block 1 and repeat again during the pulse period PP3 of the pulse block 1 and so on until the pulse period PPN of the pulse block 1. The pulse block 1 of the RF signal 134 ends at the time t14 instead of the time t10 due to the error created by the internal clock of the RF generator z.

The pulse block 2 of the RF signal 134 is consecutive to the pulse block 1 of the RF signal 134. The pulse block 2 includes N portions. The first portion of the pulse block 2 of the RF signal 134 includes three states S1, S2, and S3. Each portion of the pulse block 2 of the RF signal 134 has the states S1, S2, and S3.

Each state of a variable of the pulse block 2 of the RF signal 134 corresponds to a variable level of the variable. For example, the state S2 of the variable of the RF signal 134 has the variable level V1$c$, the state S3 of the variable of the RF signal 134 has a variable level V1.66$c$, and the state S1 of the variable of the RF signal 134 has a variable level V0.66$c$. The variable level V0.66$c$ is greater than the variable level V0.33$c$ and the variable level V1.66$c$ is greater than the variable level V0.66$c$.

During the pulse period PP1, at the time t14, the first portion of the pulse block 2 of the RF signal 132 transitions from the variable level V0.33$c$ to the variable level V1$c$. The first portion of the pulse block 2 of the RF signal 134 is at the variable level V1$c$ from the time t14 to a time t14.5, which occurs at half of a time interval between the times t14 and t15. Further, during the pulse period PP1, at the time t14.5, the first portion of the pulse block 2 of the RF signal 134 transitions from the variable level V1$c$ to the variable level V1.66$c$. The first portion of the pulse block 2 of the RF signal 134 is at the variable level V1.66$c$ from the time t14.5 to the time t15. At the time t15, the first portion of the pulse block 2 of the RF signal 134 transitions from the variable level V1.66$c$ to the variable level V0.66$c$. The first portion of the pulse block 2 of the RF signal 134 is at the variable level V0.66$c$ from the time t15 to the time t16. The pulse block 2 of the RF signal 134 transitions at the time t16 from the variable level V0.66$c$ to the variable level V1$c$, and remains at the variable level V1$c$ from the time t16 to a time t16.5, which is at half of the time interval between the times t15 and t16.

The states S1 through S3 of the variable of the RF signal 134 repeat for each pulse period of the pulse block 2 until the pulse period PPN of the pulse block 2. For example, the states S1 through S3 repeat during the pulse period PP2 of the pulse block 2 and repeat again during the pulse period PP3 of the pulse block 2 and so on until the pulse period PPN of the pulse block 2.

In one embodiment, the pulse block 1 of the RF signal 134 includes any other number of states. For example, the pulse block 1 includes four states or ten states.

In an embodiment, the pulse block 2 of the RF signal 134 includes any other number of states. For example, the pulse block 2 includes four states or five states or ten states or twenty states.

Figures 6A, 6B, 6C:
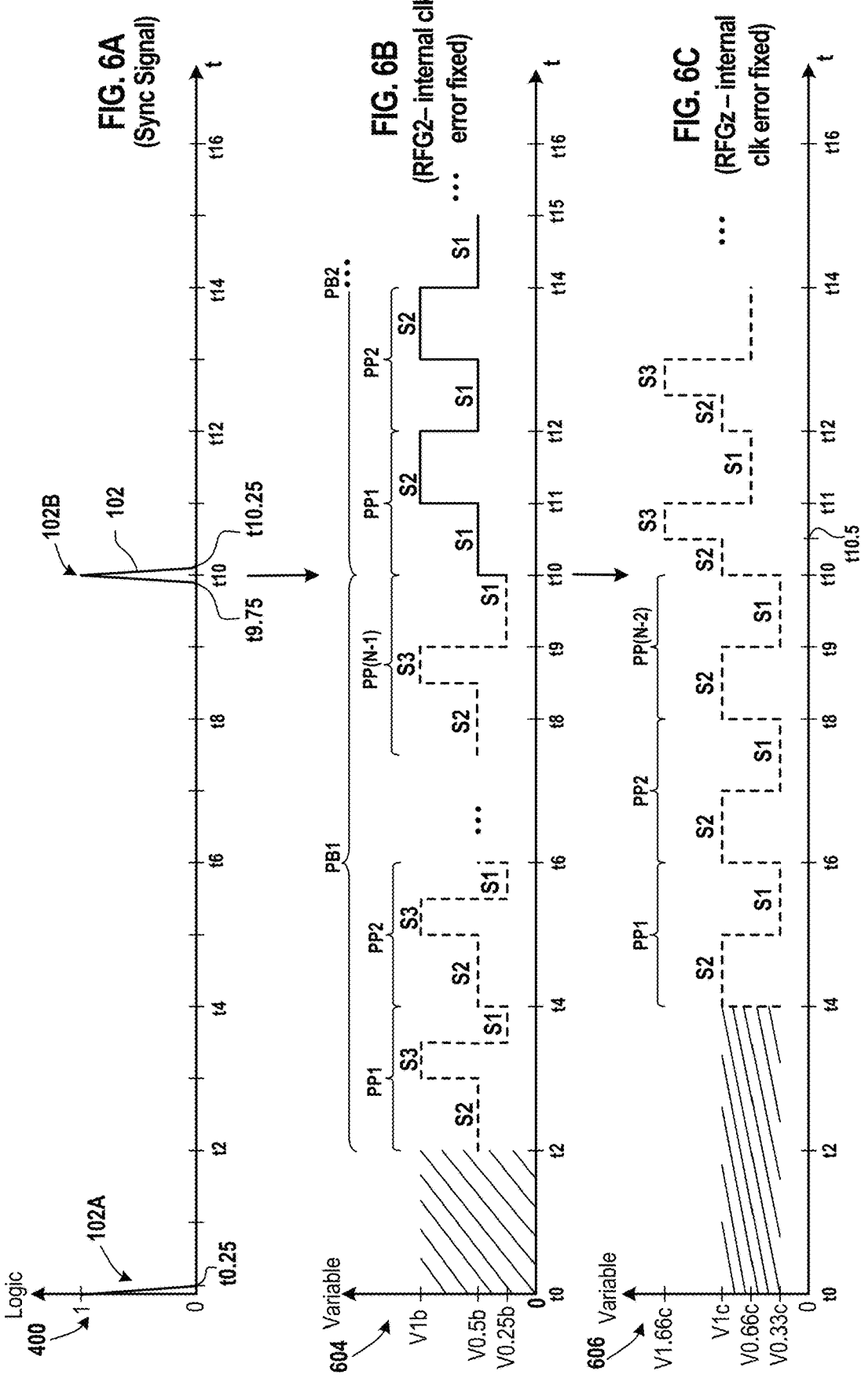
FIG. 6A depicts graph of the synchronization signal of FIG. 4A.
FIG. 6B depicts a graph to illustrate that the delay in the pulse blocks of the RF signal of FIG. 4B is reduced by the synchronization signal.
FIG. 6C depicts a graph to illustrate that the delay in the pulse blocks of the RF signal of FIG. 4C is reduced by the synchronization signal.

FIG. 6A depicts the graph 400 of the synchronization signal 102.

FIG. 6B depicts a graph 604 to illustrate that the delay in the pulse blocks of the RF signal 132 generated by the RF generator 2 (FIG. 1A) is fixed, e.g., removed or minimized or reduced or canceled, by the synchronization signal 102. The graph 604 plots the variable of the RF signal 132 versus the time t. The variable of the RF signal 132 is plotted on a y-axis and the time t is plotted on an x-axis. The pulse block 1 of the RF signal 132 is delayed by one pulse period from the time to. The delay is illustrated by oblique lines in the graph 604. The state S1 of the (N−1)th portion of the pulse block 1 of the RF signal 132 starts at the time t9. The state S1 of the (N−1)th portion of the pulse block 1 of the RF signal 132 ends at the time t10 at which the logic level of the synchronization signal 102 is 1. When the synchronization signal 102 is received by the RF generator 2 from either the processor 106, as illustrated in FIG. 1C, or the RF generator 1, as illustrated in FIGS. 1A and 1B, the state S1 of the (N−1)th portion of the pulse block 1 of the RF signal 132 ends. Also, at the time t10 at which the synchronization signal 102 is received by the RF generator 2, the states S1 through S3 of the Nth portion of the pulse block 1 of the RF signal 132 are not generated by the RF generator 2. Instead of generating the states S1 through S3 of the Nth portion of the pulse block 1 of the RF signal 132, the RF generator 2 generates the state S1 of the first portion of the pulse block 2 at the time t10.

During the pulse period PP1, at the time t10, the first portion of the pulse block 2 of the RF signal 132 transitions from the variable level V0.25$b$ to the variable level V0.5$b$. The first portion of the pulse block 2 of the RF signal 132 is at the variable level V0.5$b$ from the time t10 to the time t11. Further, during the pulse period PP1, at the time t11, the first portion of the pulse block 2 of the RF signal 132 transitions from the variable level V0.5$b$ to the variable level V1$b$. The first portion of the pulse block 2 of the RF signal 132 is at the variable level V1$b$ from the time t11 to the time t12. At the time t12, the first portion of the pulse block 2 of the RF signal 132 transitions from the variable level V1$b$ to the variable level V0.5$b$.

The states S1 and S2 of the variable of the RF signal 132 repeat for each pulse period of the pulse block 2 until the pulse period PPN of the pulse block 2. For example, the states S1 and S2 repeat during the pulse period PP2 of the pulse block 2 and repeat again during the pulse period PP3 of the pulse block 2 and so on until the pulse period PPN of the pulse block 2. As another example, due to the pulse 102B of the synchronization signal 102, the Nth portion of the pulse block 2 of the RF signal 132 ends at the time t20 instead of ending at the time t22 with the delay of one pulse period.

FIG. 6C depicts a graph 606 to illustrate that the delay in the pulse blocks of the RF signal 134 generated by the RF generator z (FIG. 1A) is fixed, e.g., removed or minimized or reduced or canceled, by the synchronization signal 102. The graph 606 plots the variable of the RF signal 134 versus the time t. The variable of the RF signal 134 is plotted on a y-axis and the time t is plotted on an x-axis. The pulse block 1 of the RF signal 134 is delayed by two pulse periods from the time t0. The delay in the pulse block 1 is illustrated by oblique lines in the graph 606. The state S1 of the (N−2)th portion of the pulse block 1 of the RF signal 134 starts at the time t9. The state S1 of the (N−2)th portion of the pulse block 1 of the RF signal 134 ends at the time t10 at which the logic level of the synchronization signal 102 is 1. When the pulse 102B of the synchronization signal 102 is received by the RF generator z from either the processor 106, as illustrated in FIG. 1C, or the RF generator 1, as illustrated in FIG. 1A, or the RF generator 2 as illustrated in FIG. 1B, the state S1 of the (N−2)th portion of the pulse block 1 of the RF signal 134 ends. Also, at the time t10 at which the synchronization signal 102 is received by the RF generator z, the states S1 and S2 of the (N−1)th portion of the pulse block 1 of the RF signal 134 and the states S1 and S2 of the Nth portion of the pulse block 1 of the RF signal 134 are not generated by the RF generator z. Instead of generating the states S1 and S2 of each of the (N−1)th and Nth portions of the pulse block 1 of the RF signal 134, the RF generator z generates the state S2 of the first portion of the pulse block 2 of the RF signal 134 at the time t10.

During the pulse period PP1, at the time t10, the first portion of the pulse block 2 of the RF signal 134 transitions from the variable level V0.33c to the variable level V1c. The first portion of the pulse block 2 of the RF signal 134 is at the variable level V1c from the time t10 to the time t10.5. Further, during the pulse period PP1, at the time t10.5, the first portion of the pulse block 2 of the RF signal 134 transitions from the variable level V1c to the variable level V1.66c. The first portion of the pulse block 2 of the RF signal 134 is at the variable level V1.66c from the time t10.5 to the time t11. At the time t11, the first portion of the pulse block 2 of the RF signal 134 transitions from the variable level V1.66c to the variable level V0.66c. The first portion of the pulse block 2 of the RF signal 134 is at the variable level V0.66c from the time t11 to the time t12. The pulse block 2 of the RF signal 134 transitions at the time t12 from the variable level V0.66c to the variable level V1c.

The states S1 through S3 of the variable of the RF signal 134 repeat for each pulse period of the pulse block 2 until the pulse period PPN of the pulse block 2. For example, the states S1 through S3 repeat during the pulse period PP2 of the pulse block 2 and repeat again during the pulse period PP3 of the pulse block 2 and so on until the pulse period PPN of the pulse block 2. As another example, due to the pulse 102B of the synchronization signal 102, the Nth portion of the pulse block 2 of the RF signal 134 ends at the time t20 instead of ending at the time t24 with the delay of two pulse periods.

Figure 7:
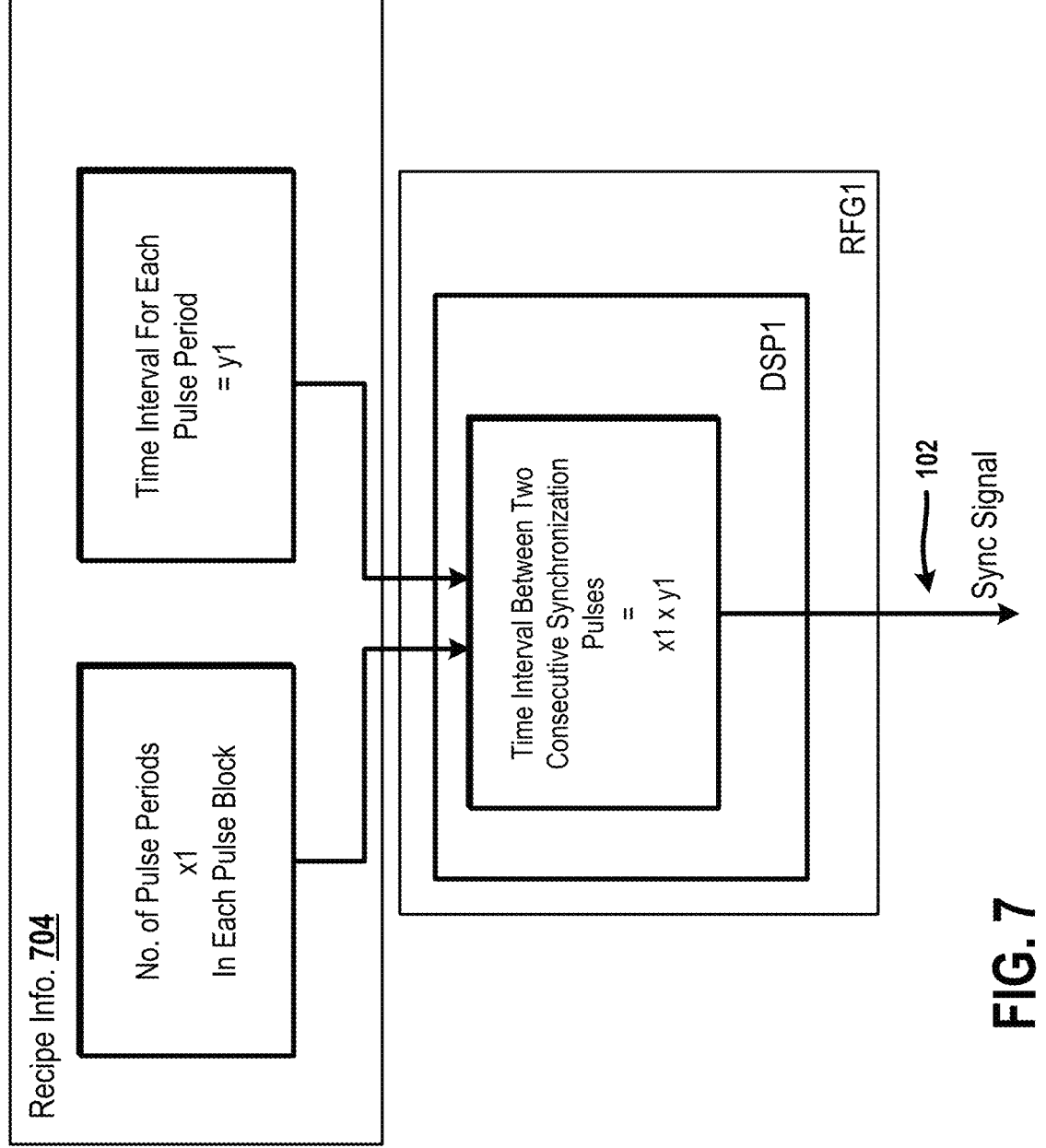
FIG. 7 is a diagram of an embodiment of a digital signal processor of an RF generator to illustrate calculation times at which pulses of the synchronization signal are to be generated.

FIG. 7 is a diagram of an embodiment of a DSP 1 of the RF generator 1 to illustrate calculation times at which pulses of the synchronization signal 102 are to be generated. Recipe information 704 is received by the DSP 1 from the processor 106 (FIG. 1A). The recipe information 704 includes a number of pulse periods x1 in each pulse block of an RF signal, such as the RF signal 130, to be generated by the RF generator 1. The recipe information 704 further includes a time interval y1 of each of the pulse periods x1. The DSP 1 multiples the number of pulse periods x1 with the time interval y1 to calculate or determine a time interval between two consecutive pulses of the synchronization signal 102. The time interval is determined to be a result of x1 multiplied by y1. The time interval defines a pre-determined frequency of the pulses, such as the pulses 102A, 102B, and 102C, of the synchronization signal 102. For example, the pre-determined frequency between any two consecutive pulses of the synchronization signal 102 is equal to the result of x1 multiplied by y1.

The DSP 1 generates the synchronization signal 102 having multiple pulses. Any two consecutive pulses of the synchronization signal 102 are separated by the time interval, which is a result of x1 multiplied by y1. The DSP 1 sends the synchronization signal 102 to the RF generators 2 through z to synchronize operation of the RF generators 2 through z with the operation of the RF generator 1. For example, the RF signals 130, 132, and 134 (FIG. 1A) repeat the pulse blocks 2, 3, and onwards in synchronization with the synchronization signal 102. To illustrate, the pulse blocks 2 of the RF signals 130, 132, and 134 are generated at the time t10 (FIGS. 5A, 6B and 6C) or with a minimal amount of delay from the time t10. To further illustrate, any of the pulse blocks 2 of the RF signals 130, 132, and 134 is generated with an amount of delay that is less than a pulse period of the pulse block.

In the embodiment in which the synchronization signal 102 is generated by the processor 102 instead of the DSP 1 of the RF generator 1, the processor 102 accesses, such as reads, the recipe information 704 from the memory device 108 (FIG. 1A) and multiplies the number of pulse periods x1 with the time interval y1 for each of the pulse periods to calculate the time interval between two consecutive pulses of the synchronization signal 102. The processor 102 generates the synchronization signal 102 having the pulses and sends the synchronization signal 102 to the RF generators 1 through z.

Figure 8A:
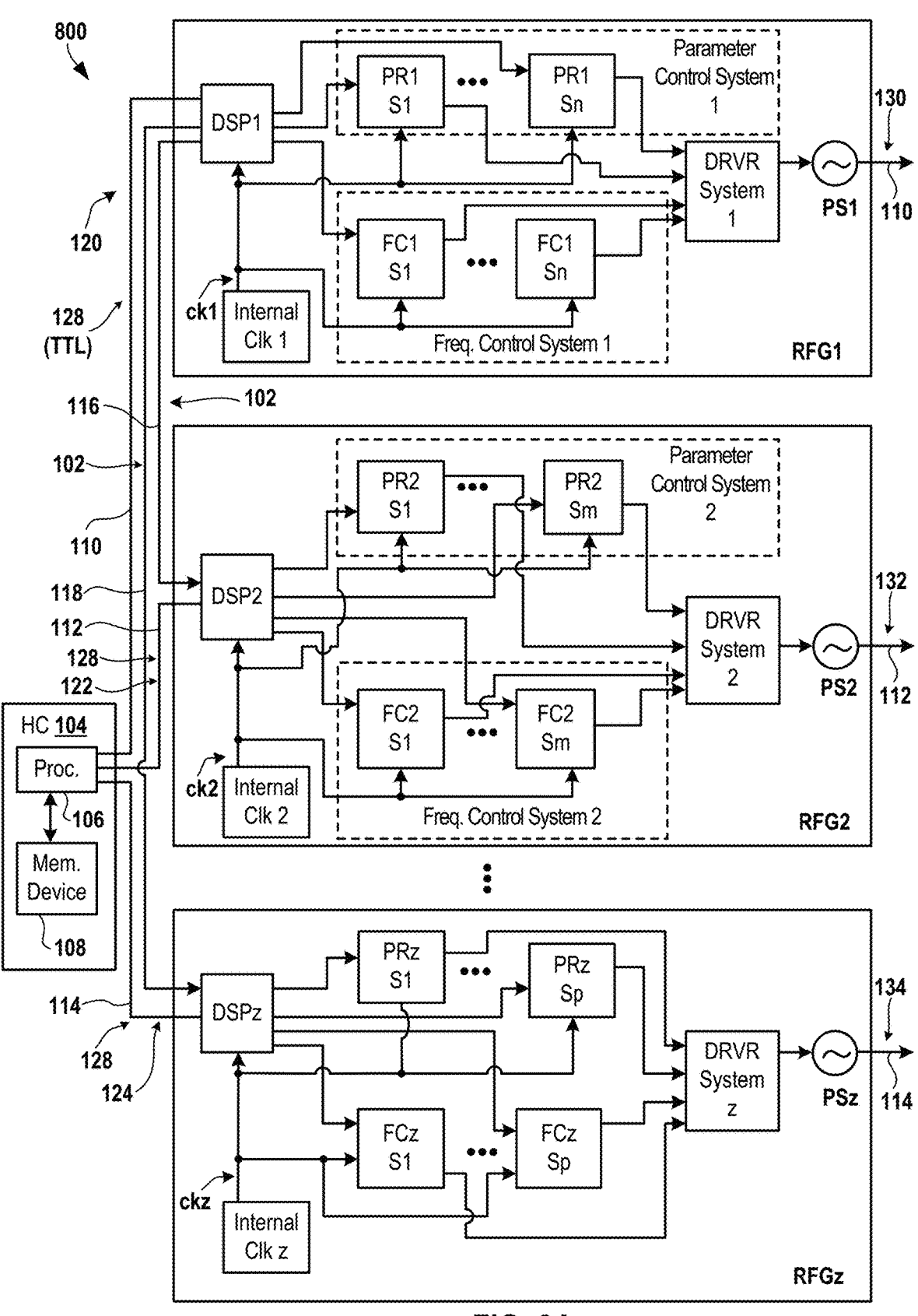
FIG. 8A is a diagram of an embodiment of a system to illustrate operation of the RF generators.

FIG. 8A is a diagram of an embodiment of a system 800 to illustrate operation of the RF generators 1 through z. The system 800 includes the RF generators 1 through z and the host computer 104. The RF generator 1 includes the DSP 1, a parameter control system 1, a frequency (Freq.) control (Ctrl.) system 1, a driver system 1, an RF power supply PS1, and an internal clock 1. The parameter control system 1 includes a parameter controller PR1S1 for the state S1 of the RF signal 130 and so on until a parameter controller PR1Sn for the state Sn of the RF signal 130, where n is a positive integer. An example of a parameter, as used herein, is voltage or power. The frequency control system 1 includes a frequency controller FC1S1 for the state S1 of the RF signal 130 and so on until a frequency controller FC1Sn for the state Sn of the RF signal 130.

An example of an internal clock, as used herein, includes a clock circuit that generates a clock signal, such as a digital square waveform, having a logic level 1 and a logic level 0. To illustrate, the clock signal transitions periodically between the two logic levels 1 and 0, and has no other logic levels.

An example of a controller, as used herein, includes a processor and a memory device. The processor of the controller is coupled to the memory device of the controller. Instead of the processor, an ASIC or a PLD is used. In one embodiment, each controller includes multiple processors and multiple memory devices. The processors are coupled to the memory devices.

An example of a driver system, as used herein, includes one or more drivers that are coupled with each other. To illustrate, a driver is a transistor.

An example of a power supply, as used herein, is an electronic oscillator or an RF oscillator or a crystal oscillator, that outputs an oscillating RF signal. An example of the oscillating RF signal is a sine wave.

The DSP 1 is coupled to the parameter controllers PR1S1 through PR1Sn and to the frequency controllers FC1S1 through FC1Sn. The internal clock 1 is coupled to the DSP 1, to the parameter controllers PR1S1 through PR1Sn, and to the frequency controllers FC1S1 through FC1Sn. The parameter controllers PR1S1 through PR1Sn and the frequency controllers FC1S1 through FC1Sn are coupled to the driver system 1, which is coupled to the power supply PS1.

The RF generator 2 includes a DSP 2, an internal clock 2, a parameter controller system 2, and a frequency control system 2. The RF generator 2 further includes a driver system 2 and a power supply PS2. The parameter controller system 2 includes multiple parameter controllers PR2S1 through PR2Sm, one for each state of the parameter of the RF signal 132, where m is a positive integer. As an example, m is a different number than the integer n. To illustrate, m is greater than or less than n. As another example, m is equal to n. The frequency controller system 2 includes multiple frequency controllers FC2S1 through FC2Sm, one for each state of a frequency of the RF signal 132.

The DSP 2 is coupled to the parameter controllers PR2S1 through PR2Sm of the parameter control system 2 and to the frequency controllers FC2S1 through FC2Sm of the frequency control system 2. The internal clock 2 is coupled to the DSP 2, to the parameter controllers PR2S1 through PR2Sm, and to the frequency controllers FC2S1 through FC2Sm. The parameter controllers PR2S1 through PR2Sm and the frequency controllers FC2S1 through FC2Sm are coupled to the driver system 2, which is coupled to the power supply PS2.

The RF generator z includes a DSP z, an internal clock z, a parameter controller system z, and a frequency control system z. The RF generator z further includes a driver system z and a power supply PS z. The parameter controller system z includes multiple parameter controllers PRzS1 through PRzSp, one for each state of the parameter of the RF signal 134, where p is a positive integer. As an example, p is a different number than the integer m. To illustrate, p is greater than or less than m. As another example, p is a different number than the integer n. To illustrate, p is greater than or less than n. As another example, p is equal to m and/or n. The frequency controller system z includes multiple frequency controllers FCzS1 through FCzSp, one for each state of a frequency of the RF signal 134.

The DSP z is coupled to the parameter controllers PRzS1 through PRzSp and to the frequency controllers FCzS1 through FCzSm. The internal clock z is coupled to the DSP z, to the parameter controllers PRzS1 through PRzSp, and to the frequency controllers FCzS1 through FC2Sm. The parameter controllers PRzS1 through PRzSp and the frequency controllers FCzS1 through FCzSm are coupled to the driver system z, which is coupled to the power supply PS z.

The processor 106 is coupled via the transfer cable 110 to the DSP 1, via the transfer cable 112 to the DSP 2, and via the transfer cable 114 to the DSP z. The DSP 1 is coupled via the communication cable 116 to the DSP 2 and is coupled via the communication cable 118 to the DSP 3.

The DSP 1 receives the recipe signal 120 from the processor 106 and extracts the recipe information for the RF signal 130 from the recipe signal 120. The DSP 1 sends the recipe information for the RF signal 130 to the parameter controllers PR1S1 through PR1Sn. For example, the DSP 1 sends the recipe information for the state S1 of the parameter of the RF signal 130 to the parameter controller PR1S1 and so until the recipe information for the state Sn of the parameter of the RF signal 130 is sent to the parameter controller PR1Sn. Similarly, the DSP 1 sends the recipe information for the state S1 of the frequency of the RF signal 130 to the frequency controller FC1S1 and so until the recipe information for the state Sn of the frequency of the RF signal 130 is sent to the frequency controller FC1Sn.

The parameter controller PR1S1 stores the recipe information for the state S1 of the parameter of the RF signal 130 in the one or more memory devices of the parameter controller PR1S1. Similarly, the parameter controller PR1Sn stores the recipe information for the state Sn of the parameter of the RF signal 130 in the one or more memory devices of the parameter controller PR1Sn.

Also, the frequency controller FC1S1 stores the recipe information for the state S1 of the frequency of the RF signal 130 in the one or more memory devices of the frequency controller FC1S1. Similarly, the frequency controller FC1Sn stores the recipe information for the state Sn of the frequency of the RF signal 130 in the one or more memory devices of the frequency controller FC1Sn.

The DSP 1, the parameter controllers PR1S1 through PR1Sn, and the frequency controllers FC1S1 through FC1Sn receive a clock signal ck1 from the internal clock 1. Also, the DSP 1 receives the TTL signal 128 from the processor 106 via the transfer cable 110, and executes the recipe information received within the recipe signal 120 in response to the reception of the TTL signal 128. For example, at a time the TCP signal 128 is received, the DSP 1 sends the TTL signal 128 to the parameter controllers PR1S1 through PR1Sn of the RF generator 1 and to the frequency controllers FC1S1 through FC1Sn of the RF generator 1. The parameter controller PR1S1 executes the recipe information for the state S1 of the parameter of the RF signal 130 to be generated upon receiving the TTL signal 128 from the DSP 1. For example, during a clock cycle 1 of the clock signal ck1, the parameter controller PR1S1 sends an instruction signal including a parameter level for the state S1 of the parameter of the RF signal 130 to the driver system 1 for a time interval for which the state S1 of the parameter of the RF signal 130 is to be generated. Upon receiving the instruction signal from the parameter controller PR1S1 during the clock cycle 1, the driver system 1 generates a current signal for the state S1 of the parameter of the RF signal 130 based on the instruction signal, and sends the current signal to the power supply PS1. The power supply PS1 receives the current signal for the state S1 of the RF signal 130 during the clock cycle 1, and generates the state S1 of the parameter of the RF signal 130.

In the example, similarly, during the clock cycle 1 of the clock signal ck1, the parameter controller PR1Sn executes the recipe information for the state Sn of the parameter of the RF signal 130 to be generated upon receiving the TTL signal 128 from the DSP 1. To illustrate, during the clock cycle 1 of the clock signal ck1, the parameter controller PR1Sn sends an instruction signal including a parameter level for the state Sn of the parameter of the RF signal 130 to the driver system 1 for a time interval for which the state Sn of the parameter of the RF signal 130 is to be generated. Upon receiving the instruction signal from the parameter controller PR1Sn during the clock cycle 1 of the clock signal ck1, the driver system 1 generates a current signal for the state Sn of the parameter of the RF signal 130 based on the instruction signal, and sends the current signal to the power supply PS1. During the clock cycle 1 of the clock signal ck1, the power supply PS1 receives the current signal for the state Sn of the parameter of the RF signal 130, and generates the state Sn of the parameter of the RF signal 130.

Continuing with the example, during the clock cycle 1 of the clock signal ck1, the frequency controller FC1Sn executes the recipe information for the state Sn of the frequency of the RF signal 130 to be generated upon receiving the TTL signal 128 from the DSP 1. To illustrate, during the clock cycle 1 of the clock signal ck1, the frequency controller FC1Sn sends an instruction signal including a frequency level for the state Sn of the frequency of the RF signal 130 to the driver system 1 for a time interval for which the state Sn of the frequency of the RF signal 130 is to be generated. Upon receiving the instruction signal from the frequency controller FC1Sn during the clock cycle 1 of the clock signal ck1, the driver system 1 generates a current signal for the state Sn of the frequency of the RF signal 130 based on the instruction signal, and sends the current signal to the power supply PS1. During the clock cycle 1 of the clock signal ck1, the power supply PS1 receives the current signal for the state Sn of the frequency of the RF signal 130, and generates the state Sn of the frequency of the RF signal 130.

The states S1 through Sn of the variable of the RF signal 130 are generated by the power supply PS1 in synchronization with the clock signal ck1. For example, the states S1 through Sn of the parameter of the RF signal 130 repeat during a clock cycle 2 of the clock signal ck1. The clock cycle 2 of the clock signal ck1 is consecutive to the clock cycle 1 of the clock signal ck1. There are no other clock cycles between the clock cycle 1 of the clock signal ck1 and the clock cycle 2 of the clock signal ck1.

In a similar manner as that of the RF generator 1, the RF generator 2 generates the RF signal 132 having multiple states S1 through Sm, where m is a positive integer. For example, the DSP 2 receives the recipe signal 122 and extracts the recipe information for the RF signal 132 from the recipe signal 122. The DSP 2 sends the recipe information for the RF signal 132 to the parameter controllers PR2S1 through PR2Sm. For example, the DSP 2 sends the recipe information for the state S1 of the parameter of the RF signal 132 to the parameter controller PR2S1 and so until the recipe information for the state Sm of the parameter of the RF signal 132 is sent to the parameter controller PR2Sm. Similarly, the DSP 2 sends the recipe information for the state S1 of the frequency of the RF signal 132 to the frequency controller FC2S1 and so until the recipe information for the state Sm of the frequency of the RF signal 132 is sent to the frequency controller FC2Sm.

The parameter controller PR2S1 stores the recipe information for the state S1 of the parameter of the RF signal 132 in the one or more memory devices of the parameter controller PR2S1. Similarly, the parameter controller PR2Sm stores the recipe information for the state Sm of the parameter of the RF signal 132 in the one or more memory devices of the parameter controller PR2Sm.

Also, the frequency controller FC2S1 stores the recipe information for the state S1 of the frequency of the RF signal 132 in the one or more memory devices of the frequency controller FC2S1. Similarly, the frequency controller FC2Sm stores the recipe information for the state Sn of the frequency of the RF signal 132 in the one or more memory devices of the frequency controller FC2Sm.

The DSP 2, the parameter controllers PR2S1 through PR2Sm, and the frequency controllers FC2S1 through FC2Sm receive a clock signal ck2 from the internal clock 2. Also, in response to receiving the TTL signal 128 from the processor 106 via the transfer cable 112, the DSP 2 executes the recipe information received within the recipe signal 122. For example, at a time the TTL signal 128 is received, the DSP 2 sends the TTL signal 128 to the parameter controllers PR2S1 through PR2Sm of the RF generator 2 and to the frequency controllers FC2S1 through FC2Sm of the RF generator 2. The parameter controller PR2S1 executes the recipe information for the state S1 of the parameter of the RF signal 132 to be generated upon receiving the TTL signal 128 from the DSP 2. For example, during a clock cycle 1 of the clock signal ck2, the parameter controller PR2S1 sends an instruction signal including a parameter level for the state S1 of the parameter of the RF signal 132 to the driver system 2 for a time interval for which the state S1 of the parameter of the RF signal 132 is to be generated. Upon receiving the instruction signal from the parameter controller PR2S1 during the clock cycle 1, the driver system 2 generates a current signal for the state S1 of the parameter of the RF signal 132 based on the instruction signal, and sends the current signal to the power supply PS2. The power supply PS2 receives the current signal for the state S1 of the RF signal 132 during the clock cycle 1, and generates the state S1 of the parameter of the RF signal 132.

In the example, similarly, during the clock cycle 1 of the clock signal ck2, the parameter controller PR2Sm executes the recipe information for the state Sm of the parameter of the RF signal 132 to be generated upon receiving the TTL signal 128 from the DSP 2. To illustrate, during the clock cycle 1 of the clock signal ck2, the parameter controller PR2Sm sends an instruction signal including a parameter level for the state Sm of the parameter of the RF signal 132 to the driver system 2 for a time interval for which the state Sm of the parameter of the RF signal 132 is to be generated. Upon receiving the instruction signal from the parameter controller PR2Sm during the clock cycle 1 of the clock signal ck2, the driver system 2 generates a current signal for the state Sm of the parameter of the RF signal 132 based on the instruction signal, and sends the current signal to the power supply PS2. During the clock cycle 1 of the clock signal ck2, the power supply PS2 receives the current signal for the state Sm of the parameter of the RF signal 132, and generates the state Sm of the parameter of the RF signal 132.

Continuing with the example, during the clock cycle 1 of the clock signal ck2, the frequency controller FC2Sm executes the recipe information for the state Sm of the frequency of the RF signal 132 to be generated upon receiving the TTL signal 128 from the DSP 2. To illustrate, during the clock cycle 1 of the clock signal ck2, the frequency controller FC2Sm sends an instruction signal including a frequency level for the state Sm of the frequency of the RF signal 132 to the driver system 2 for a time interval for which the state Sm of the frequency of the RF signal 132 is to be generated. Upon receiving the instruction signal from the frequency controller FC2Sm during the clock cycle 1 of the clock signal ck2, the driver system 2 generates a current signal for the state Sm of the frequency of the RF signal 132 based on the instruction signal, and sends the current signal to the power supply PS2. During the clock cycle 1 of the clock signal ck2, the power supply PS2 receives the current signal for the state Sm of the frequency of the RF signal 132, and generates the state Sm of the frequency of the RF signal 132.

The states S1 through Sm of the variable of the RF signal 132 are generated by the power supply PS2 in synchronization with the clock signal ck2. For example, the states S1 through Sm of the parameter of the RF signal 132 repeat during a clock cycle 2 of the clock signal ck2. The clock cycle 2 of the clock signal ck2 is consecutive to the clock cycle 1 of the clock signal ck2. There are no other clock cycles between the clock cycle 1 of the clock signal ck2 and the clock cycle 2 of the clock signal ck2.

Also, in a similar manner as that of the RF generator 1, the RF generator z generates the RF signal 134 having multiple states S1 through Sp, where p is a positive integer. For example, the DSP z receives the recipe signal 124 and extracts the recipe information for the RF signal 134 from the recipe signal 124. The DSP z sends the recipe information for the RF signal 134 to the parameter controllers PRzS1 through PRzSp. For example, the DSP z sends the recipe information for the state S1 of the parameter of the RF signal 134 to the parameter controller PRzS1 and so until the recipe information for the state Sp of the parameter of the RF signal 134 is sent to the parameter controller PRzSp. Similarly, the DSP z sends the recipe information for the state S1 of the frequency of the RF signal 134 to the frequency controller FCzS1 and so until the recipe information for the state Sp of the frequency of the RF signal 134 is sent to the frequency controller FCzSp.

The parameter controller PRzS1 stores the recipe information for the state S1 of the parameter of the RF signal 134 in the one or more memory devices of the parameter controller PRzS1. Similarly, the parameter controller PRzSp stores the recipe information for the state Sp of the parameter of the RF signal 134 in the one or more memory devices of the parameter controller PRzSp.

Also, the frequency controller FC2S1 stores the recipe information for the state S1 of the frequency of the RF signal 134 in the one or more memory devices of the frequency controller FCzS1. Similarly, the frequency controller FCzSp stores the recipe information for the state Sp of the frequency of the RF signal 134 in the one or more memory devices of the frequency controller FCzSp.

The DSP z, the parameter controllers PRzS1 through PRzSp, and the frequency controllers FCzS1 through FC2Sp receive a clock signal ckz from the internal clock z. Also, in response to receiving the TTL signal 128 from the processor 106 via the transfer cable 114, the DSP z executes the recipe information received within the recipe signal 124. For example, at a time the TTL signal 128 is received, the DSP z sends the TTL signal 128 to the parameter controllers PRzS1 through PRzSp of the RF generator z and to the frequency controllers FCzS1 through FC2Sp of the RF generator z. The parameter controller PRzS1 executes the recipe information for the state S1 of the parameter of the RF signal 134 to be generated upon receiving the TTL signal 128 from the DSP z. For example, during a clock cycle 1 of the clock signal ckz, the parameter controller PRzS1 sends an instruction signal including a parameter level for the state S1 of the parameter of the RF signal 134 to the driver system z for a time interval for which the state S1 of the parameter of the RF signal 134 is to be generated. Upon receiving the instruction signal from the parameter controller PRzS1 during the clock cycle 1, the driver system z generates a current signal for the state S1 of the parameter of the RF signal 134 based on the instruction signal, and sends the current signal to the power supply PSz. The power supply PSz receives the current signal for the state S1 of the RF signal 134 during the clock cycle 1, and generates the state S1 of the parameter of the RF signal 134.

In the example, similarly, during the clock cycle 1 of the clock signal ckz, the parameter controller PRsSp executes the recipe information for the state Sp of the parameter of the RF signal 134 to be generated upon receiving the TTL signal 128 from the DSP z. To illustrate, during the clock cycle 1 of the clock signal ckz, the parameter controller PRzSp sends an instruction signal including a parameter level for the state Sp of the parameter of the RF signal 134 to the driver system z for a time interval for which the state Sp of the parameter of the RF signal 134 is to be generated. Upon receiving the instruction signal from the parameter controller PRzSp during the clock cycle 1 of the clock signal ckz, the driver system z generates a current signal for the state Sp of the parameter of the RF signal 134 based on the instruction signal, and sends the current signal to the power supply PSz. During the clock cycle 1 of the clock signal ckz, the power supply PSz receives the current signal for the state Sp of the parameter of the RF signal 134, and generates the state Sp of the parameter of the RF signal 134.

Continuing with the example, during the clock cycle 1 of the clock signal ckz, the frequency controller FCzSp executes the recipe information for the state Sp of the frequency of the RF signal 134 to be generated upon receiving the TTL signal 128 from the DSP z. To illustrate, during the clock cycle 1 of the clock signal ckz, the frequency controller FCzSp sends an instruction signal including a frequency level for the state Sp of the frequency of the RF signal 134 to the driver system z for a time interval for which the state Sp of the frequency of the RF signal 134 is to be generated. Upon receiving the instruction signal from the frequency controller FC2Sp during the clock cycle 1 of the clock signal ckz, the driver system z generates a current signal for the state Sp of the frequency of the RF signal 134 based on the instruction signal, and sends the current signal to the power supply PSz. During the clock cycle 1 of the clock signal ckz, the power supply PSz receives the current signal for the state Sp of the frequency of the RF signal 134, and generates the state Sp of the frequency of the RF signal 134.

The states S1 through Sp of the variable of the RF signal 134 are generated by the power supply PSz in synchronization with the clock signal ckz. For example, the states S1 through Sp of the parameter of the RF signal 134 repeat during a clock cycle 2 of the clock signal ckz. The clock cycle 2 of the clock signal ckz is consecutive to the clock cycle 1 of the clock signal ckz. There are no other clock cycles between the clock cycle 1 of the clock signal ckz and the clock cycle 2 of the clock signal ckz.

The DSP 1 of the RF generator 1 generates the synchronization signal 102 and sends the synchronization signal 102 to the parameter controllers PR1S1 through PR2Sn and to the frequency controllers FC1S1 through FC1Sn. Because there is no error created by the internal clock 1 of the RF generator 1, there is no need to reduce a delay in the pulse blocks of the RF signal 130. Rather, the parameter control system 1 and the frequency control system 1 control the power supply PS1 in the manner described above for generating the pulse blocks of the RF signal 130, and the pulse blocks are already synchronized with the synchronization signal 102. In case there is an error created by the internal clock 1 of the RF generator 1, the pulse blocks of the RF signal 130 are synchronized with the synchronization signal 102 by the parameter controllers PR1S1 through PR2Sn and the frequency controllers FC1S1 through FC1Sn in a manner described below.

When the DSP 2 of the RF generator 2 receives a pulse of the synchronization signal 102 from the DSP 1 via the communication cable 116, the DSP 2 sends the pulse of the synchronization signal 102 to the parameter controllers PR2S1 through PR2Sm and to the frequency controllers FC2S1 through FC2Sm. Upon receiving the pulse of the synchronization signal 102, the parameter controllers PR2S1 through PR2Sm and the frequency controllers FC2S1 through FC2Sm do not generate instruction signals for generating one or more remaining portions, such as the Nth portion or the (N–1)th and Nth portions, of a currently-generated pulse block of the RF signal 132. An example of the currently-generated pulse block of the RF signal 132 is a pulse block that is being generated at a time a pulse of the synchronization signal 102 is received by the parameter controllers PR2S1 through PR2Sm and the frequency controllers FC2S1 through FC2Sm from the DSP 2. To illustrate, the currently-generated pulse block is the pulse block 1 of the RF signal 132 at the time t10 at which the synchronization pulse 102B is received. As another illustration, the currently-generated pulse block is the pulse block 2 of the RF signal 132 at the time t20 at which the synchronization pulse 102C is received.

Instead of generating the one or more remaining portions of the currently-generated pulse block of the RF signal 132 at a time the pulse, such as the pulse 102A, of the synchronization signal 102 is received by the RF generator 2, the RF generator 2 generates a consecutively following pulse block, such as the pulse block 2, of the RF signal 132. For example, with reference to FIG. 6B, instead of the parameter controllers PR2S2, PR2S3, and PR2S1 sending the parameter levels for the states S2, S3, and S1 of the Nth portion of the pulse block 1 of the RF signal 132 to the driver system 2 at the time t10, the parameter controllers PR2S1 and PR2S2 send the parameter levels for the states S1 and S2 of the first portion of the pulse block 2 of the RF signal 132 to the driver system 2. As another example, instead of the frequency controllers FC2S2, FC2S3, and FC2S1 sending the frequency levels for the states S2, S3, and S1 of the Nth portion of the pulse block 1 of the RF signal 132 to the driver system 2 at the time t10, the frequency controllers FC2S1 and FC2S2 send the frequency levels for the states S1 and S2 of the first portion of the pulse block 2 of the RF signal 132 to the driver system 2.

As yet another example, with reference to FIG. 6B, in case the Nth portion of the pulse block 1 of the RF signal 132 is delayed by one or more states, such as the state S1, of the Nth pulse period of the pulse block 1, instead of the parameter controller PR2S1 sending the parameter level for the state S1 of the Nth portion of the pulse block 1 of the RF signal 132 to the driver system 2 at the time t10, the parameter controller PR2S1 sends the parameter level for the state S1 of the first portion of the pulse block 2 of the RF signal 132 to the driver system 2. As another example, in case the Nth portion of the pulse block 1 of the RF signal 132 is delayed by one or more states, such as the state S1, of the Nth pulse period of the pulse block 1, instead of the frequency controller FC2S1 sending the frequency level for the state S1 of the Nth portion of the pulse block 1 of the RF signal 132 to the driver system 2 at the time t10, the frequency controller FC2S1 sends the frequency level for the state S1 of the first portion of the pulse block 2 of the RF signal 132 to the driver system 2.

Similarly, when the DSP z of the RF generator z receives the pulse of the synchronization signal 102 from the DSP z via the communication cable 118, the DSP z sends the pulse of the synchronization signal 102 to the parameter controllers PRzS1 through PRzSp and to the frequency controllers FCzS1 through FCzSp. Upon receiving the pulse of the synchronization signal 102, the parameter controllers PRzS1 through PRzSp and the frequency controllers FC2S1 through FCzSp do not generate instruction signals for generating one or more remaining portions, such as the Nth portion or the (N–1)th and Nth portions or the (N–2)th, (N–1)th and Nth portions, of a currently-generated pulse block of the RF signal 134. An example of the currently-generated pulse block of the RF signal 134 is a pulse block that is being generated at a time a pulse of the synchronization signal 102 is received by the parameter controllers PRzS1 through PRzSp and the frequency controllers FCzS1 through FCzSp from the DSP z. To illustrate, the currently-generated pulse block is the pulse block 1 of the RF signal 134 at the time t10 at which the synchronization pulse 102B is received. As another illustration, the currently-generated pulse block is the pulse block 2 of the RF signal 134 at the time t20 at which the synchronization pulse 102C is received.

Instead of generating the one or more remaining portions of the currently-generated pulse block of the RF signal 134 at the time the pulse, such as the pulse 102B, of the synchronization signal 102 is received by the RF generator z, the RF generator z generates a consecutively following pulse block, such as the pulse block 2, of the RF signal 134. For example, with reference to FIG. 6C, instead of the parameter controllers PRzS2 and PRzS1 sending the parameter levels for the states S2 and S1 of the (N–1)th portion of the pulse block 1 of the RF signal 134 to the driver system z at the time t10, the parameter controllers PRzS2, PRzS3, and PRzS1 send the parameter levels for the states S2, S3, and S1 of the first portion of the pulse block 2 of the RF signal 134 to the driver system z. As another example, instead of the frequency controllers FCzS2 and FCzS1 sending the frequency levels for the states S2 and S1 of the (N–1)th portion of the pulse block 1 of the RF signal 134 to the driver system z at the time t10, the frequency controllers FCzS2, FCzS3, and FCzS1 send the frequency levels for the states S2, S3, and S1 of the first portion of the pulse block 2 of the RF signal 134 to the driver system z.

As yet another example, with reference to FIG. 6C, in case the Nth portion of the pulse block 1 of the RF signal 134 is delayed by one or more states, such as the state S1, of the Nth pulse period of the pulse block 1, instead of the parameter controller PRzS1 sending the parameter level for the state S1 of the Nth portion of the pulse block 1 of the RF signal 134 to the driver system z at the time t10, the parameter controller PRzS2 sends the parameter level for the state S2 of the first portion of the pulse block 2 of the RF signal 134 to the driver system z. As another example, in case the Nth portion of the pulse block 1 of the RF signal 134 is delayed by one or more states, such as the state S1, of the Nth pulse period of the pulse block 1, instead of the frequency controller FCzS1 sending the frequency level for the state S1 of the Nth portion of the pulse block 1 of the RF signal 134 to the driver system z at the time t10, the frequency controller FCzS2 sends the frequency level for the state S2 of the first portion of the pulse block 2 of the RF signal 134 to the driver system z. In this manner, each pulse block, such as the pulse block 2 or the pulse block 3, of the RF signals 130, 132, and 134 is generated in synchronization with the synchronization signal 102.

In one embodiment, instead of the DSP 1, the processor 106 generates the synchronization signal 102. The processor 106 sends the synchronization signal 102 via the transfer cable 110 to the DSP 1, via the transfer cable 112 to the DSP 2, and via the transfer cable 114 to the DSP z. The RF generators 2 through z operate in the same manner as that described above with reference to FIG. 8A upon receiving the synchronization signal 102. When the DSP 1 of the RF generator 1 receives a pulse of the synchronization signal 102 from the processor 106, the DSP 1 sends the pulse of the synchronization signal 102 to the parameter controllers PR1S1 through PR1Sn and to the frequency controllers FC1S1 through FC1Sn. Upon receiving the pulse of the synchronization signal 102, the parameter controllers PR1S1 through PR1Sn and the frequency controllers FC1S1 through FC1Sn do not generate instruction signals for generating one or more remaining portions, such as the Nth portion or the (N−1)th and Nth portions, of a currently-generated pulse block of the RF signal 130. An example of the currently-generated pulse block of the RF signal 130 is a pulse block that is being generated at a time a pulse of the synchronization signal 102 is received by the parameter controllers PR1S1 through PR1Sn and the frequency controllers FC1S1 through FC1Sn from the DSP 1. To illustrate, the currently-generated pulse block is the pulse block 1 of the RF signal 130 at the time t10 at which the pulse 102B is received. As another illustration, the currently-generated pulse block is the pulse block 2 of the RF signal 130 at the time t20 at which the pulse 102C is received.

Continuing with the embodiment of the preceding paragraph, instead of generating the one or more remaining portions of the currently-generated pulse block of the RF signal 130 at a time the pulse, such as the pulse 102B, of the synchronization signal 102 is received by the RF generator 1, the RF generator 1 generates a consecutively following pulse block, such as the pulse block 2, of the RF signal 130. For example, with reference to FIG. 5A, in case the Nth portion of the pulse block 1 of the RF signal 130 is delayed by one pulse period of the pulse block 1, instead of the parameter controllers PR1S4, PR1S3, PR1S2, and PR1S1 sending the parameter levels for the states S4, S3, S2, and S1 of the Nth portion of the pulse block 1 of the RF signal 130 to the driver system 1 at the time t10, the parameter controllers PR1S3, PR1S2, and PR1S1 send the parameter levels for the states S3, S2, and S1 of the first portion of the pulse block 2 of the RF signal 130 to the driver system 1. As another example, in case the Nth portion of the pulse block 1 of the RF signal 130 is delayed by one pulse period, instead of the frequency controllers FC1S4, FC1S3, FC1S2, and FC1S1 sending the frequency levels for the states S4, S3, S2, and S1 of the Nth portion of the pulse block 1 of the RF signal 130 to the driver system 1 at the time t10, the frequency controllers FC1S3, FC1S2, and FC1S1 send the frequency levels for the states S3, S2, and S1 of the first portion of the pulse block 2 of the RF signal 130 to the driver system 1.

Also, in the embodiment, as yet another example, with reference to FIG. 5A, in case the Nth portion of the pulse block 1 of the RF signal 130 is delayed by one or more states, such as the state S1, of the Nth pulse period of the pulse block 1, instead of the parameter controller PR1S1 sending the parameter level for the state S1 of the Nth portion of the pulse block 1 of the RF signal 130 to the driver system 1 at the time t10, the parameter controller PR1S3 sends the parameter level for the state S3 of the first portion of the pulse block 2 of the RF signal 130 to the driver system 1. As another example, with reference to FIG. 5A, in case the Nth portion of the pulse block 1 of the RF signal 130 is delayed by one or more states, such as the state S1, of the Nth pulse period of the pulse block 1, instead of the frequency controller FC1S1 sending the frequency level for the state S1 of the Nth portion of the pulse block 1 of the RF signal 130 to the driver system 1 at the time t10, the frequency controller FC1S3 sends the frequency level for the state S3 of the first portion of the pulse block 2 of the RF signal 130 to the driver system 1.

In one embodiment, a combination of a frequency controller system of an RF generator, a parameter controller system of the RF generator, and a DSP of the RF generator is sometimes referred to herein as a processor system of the RF generator. The processor system includes one or more processors and one or more memory devices. The one or more processors are coupled to the one or more memory devices.

In an embodiment, instead of a combination of a frequency controller system of an RF generator, a parameter controller system of the RF generator, and a DSP of the RF generator, one or more controllers are used in the RF generator. For example, the one or more controllers includes one or more processors and one or more memory devices. The one or more processors are coupled to the one or more memory devices. The one or more processors execute logic to perform the functions, described herein, as being performed by the combination of the frequency controller system of an RF generator, the parameter controller system of the RF generator, and the DSP of the RF generator.

In one embodiment, the frequency of an RF signal, described herein, such as the RF signal 130, or 132, or 134, has one state, such as a single state. The frequency of the RF signal does not transition from one frequency level to another.

In one embodiment, the parameter of an RF signal, such as the RF signal 130, or 132, or 134, has one state, such as a single state. The parameter of the RF signal does not transition from one parameter level to another.

Figure 8B:
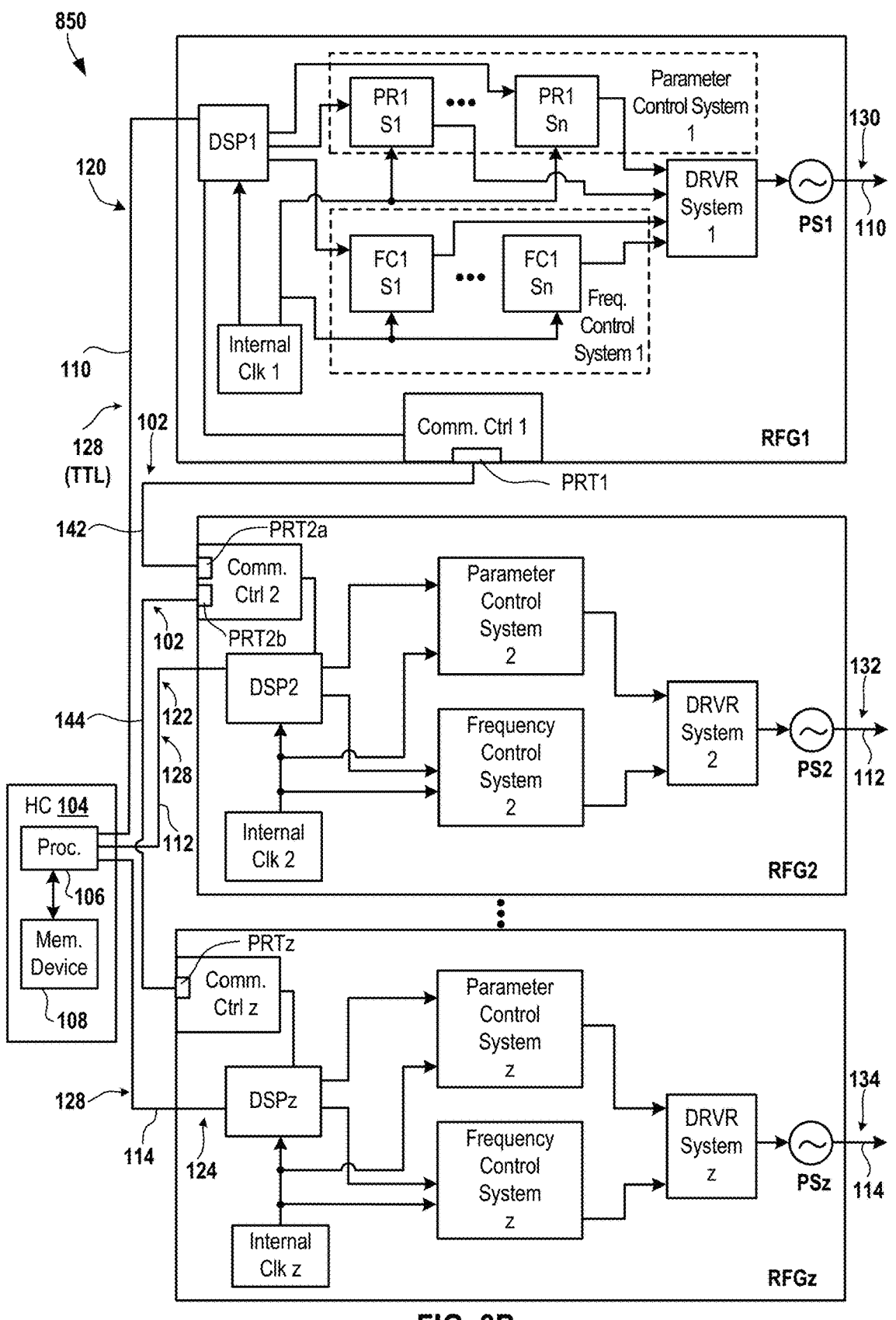
FIG. 8B is a diagram of an embodiment of a system to illustrate use of EtherCAT for sending the synchronization signal to various RF generators from a master RF generator.

FIG. 8B is a diagram of an embodiment of a system 850 to illustrate use of EtherCAT for sending the synchronization signal 102 to the RF generators 2 through 2 from the RF generator 1. The system 850 includes the host computer 104, and the RF generators 1 through z.

The RF generator 1 includes a communication controller 1. Similarly, the RF generator 2 includes a communication controller 2 and the RF generator z includes a communication controller z. The communication controller 1 includes the port PRT1. The communication controller 2 includes the port PRT2a and the port PRT2b. The communication controller z includes the port PRTz.

The communication controller 1 is coupled to the DSP 1. The communication controller 2 is coupled to the DSP 2, and the communication controller z is coupled to the DSP z.

The communication controller 1 receives the synchronization signal 102 from the DSP 1, extracts the timing information for the RF generators 2 through z from the synchronization signal 102, and embeds the timing information in one or more EtherCAT frames. The communication controller 1 sends the one or more EtherCAT frames via the port PRT1 and the communication cable 142 to the port PRT2a. The communication controller 2 extracts the timing information of the synchronization signal 102 from the one or more EtherCAT frames during a time period in which the one or more EtherCAT frames are being transferred from the port PRT2a to the port PRT2b, and sends the timing information to the DSP 2 for execution of the timing information. The DSP 2 executes the timing information of the synchronization signal 102 in the same manner described above with reference to FIG. 8A by sending pulses of the synchronization signal to the parameter control system 1 and to the frequency control system 1.

The communication controller 2 sends the one or more EtherCAT frames via the port PRT2*b* and the communication cable 144 to the port PRTz. The communication controller z extracts the timing information of the synchronization signal 102 from the one or more EtherCAT frames, and sends the timing information to the DSP z for execution of the timing information. The DSP z executes the timing information of the synchronization signal 102 in the same manner described above with reference to FIG. 8A by sending pulses of the synchronization signal to the parameter control system z and to the frequency control system 7.

For a return path of the one or more EtherCAT frames, the communication controller z further transfers the one or more EtherCAT frames from the port PRTz via the communication cable 144 to the port PRT2*b*. The communication controller 2 transfers the one or more EtherCAT frames from the port PRT2*b* to the port PRT2*a*. The communication controller 2 sends the one or more EtherCAT frames from the port PRT2*a* via the communication cable 142 to the port PRT1. The communication controller 1 obtains or extracts the timing information of the synchronization signal 102 from the one or more EtherCAT frames and sends the timing information back to the DSP 1 of the RF generator 1.

In one embodiment, the timing information of the synchronization signal 102 is the same as the synchronization signal 102.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipe to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods, described herein, are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

The invention claimed is:

1. A computer comprising:
a processor configured to:
   provide a first recipe set to a first radio frequency (RF) generator, wherein the first recipe set includes information regarding a first plurality of pulse blocks;
   provide a second recipe set to a second RF generator, wherein the second recipe set includes information regarding a second plurality of pulse blocks;
   generate a synchronization signal;
   provide the synchronization signal to the first RF generator to control the first RF generator to output a first one of the first plurality of pulse blocks in synchronization with the synchronization signal; and
   provide the synchronization signal to the second RF generator to control the second RF generator to output a first one of the second plurality of pulse blocks in synchronization with the synchronization signal; and
a memory device coupled to the processor.

2. The computer of claim 1, wherein the information regarding the first plurality of pulse blocks includes a number of the first plurality of pulse blocks, a time interval of each pulse period in each of the first plurality of pulse blocks, a number of pulse periods within each of the first plurality of pulse blocks, a number of states during each of the pulse periods, a duty cycle for each of the states, and a variable level for each of the states.

3. The computer of claim 1, wherein the information regarding the second plurality of pulse blocks includes a number of the second plurality of pulse blocks, a time interval of each pulse period in each of the second plurality of pulse blocks, a number of pulse periods within each of the second plurality of pulse blocks, a number of states during each of the pulse periods, a duty cycle for each of the states, and a variable level for each of the states.

4. The computer of claim 1, wherein the synchronization signal includes a series of pulses at periodic intervals.

5. The computer of claim 1, wherein the first plurality of pulse blocks includes the first one of the first plurality of pulse blocks and a second one of the first plurality of pulse blocks, wherein the second plurality of pulse blocks includes the first one of the second plurality of pulse blocks and a second one of the second plurality of pulse blocks, wherein each of the first plurality of pulse blocks includes a first portion and a second portion, wherein each of the second plurality of pulse blocks includes a first portion and a second portion, wherein the first and second pluralities of pulse blocks are in synchronization with the synchronization signal when the second portion of the first one of the first plurality of pulse blocks is controlled to be output from the first RF generator without controlling the second RF generator to output the second portion of the second one of the second plurality of pulse blocks.

6. The computer of claim 5, wherein the second one of the second plurality of pulse blocks is controlled to be output preceding the first one of the second plurality of pulse blocks, and the second one of the first plurality of pulse blocks is controlled to be output preceding the first one of the first plurality of pulse blocks.

7. The computer of claim 1, wherein the first plurality of pulse blocks includes the first one of the first plurality of pulse blocks and a second one of the first plurality of pulse blocks, wherein the second plurality of pulse blocks includes the first one of the second plurality of pulse blocks and a second one of the second plurality of pulse blocks, wherein each of the first plurality of pulse blocks includes a first portion and a second portion, wherein each of the second plurality of pulse blocks includes a first portion and a second portion, wherein the first and second pluralities of pulse blocks are in synchronization with the synchronization signal when the first portion of the first one of the first plurality of pulse blocks is controlled to be output from the first RF generator at a time the second RF generator has output the first portion of the second one of the second plurality of pulse blocks.

8. The computer of claim 7, wherein the second one of the second plurality of pulse blocks is controlled to be output preceding the first one of the second plurality of pulse blocks, and the second one of the first plurality of pulse blocks is controlled to be output preceding the first one of the first plurality of pulse blocks.

9. A method comprising:
    providing a first recipe set to a first radio frequency (RF) generator, wherein the first recipe set includes information regarding a first plurality of pulse blocks;
    providing a second recipe set to a second RF generator, wherein the second recipe set includes information regarding a second plurality of pulse blocks;
    generating a synchronization signal;
    providing the synchronization signal to the first RF generator to control the first RF generator to output a first one of the first plurality of pulse blocks in synchronization with the synchronization signal; and
    providing the synchronization signal to the second RF generator to control the second RF generator to output a first one of the second plurality of pulse blocks in synchronization with the synchronization signal.

10. The method of claim 9, wherein the information regarding the first plurality of pulse blocks includes a number of the first plurality of pulse blocks, a time interval of each pulse period in each of the first plurality of pulse blocks, a number of pulse periods within each of the first plurality of pulse blocks, a number of states during each of the pulse periods, a duty cycle for each of the states, and a variable level for each of the states.

11. The method of claim 9, wherein the information regarding the second plurality of pulse blocks includes a number of the second plurality of pulse blocks, a time interval of each pulse period in each of the second plurality of pulse blocks, a number of pulse periods within each of the second plurality of pulse blocks, a number of states during each of the pulse periods, a duty cycle for each of the states, and a variable level for each of the states.

12. The method of claim 9, wherein the synchronization signal includes a series of pulses at periodic intervals.

13. The method of claim 9, wherein the first plurality of pulse blocks includes the first one of the first plurality of pulse blocks and a second one of the first plurality of pulse blocks, wherein the second plurality of pulse blocks includes the first one of the second plurality of pulse blocks and a second one of the second plurality of pulse blocks, wherein each of the first plurality of pulse blocks includes a first portion and a second portion, wherein each of the second plurality of pulse blocks includes a first portion and a second portion, wherein the first and second pluralities of pulse blocks are in synchronization with the synchronization signal when the second portion of the first one of the first plurality of pulse blocks is controlled to be output from the first RF generator without controlling the second RF generator to output the second portion of the second one of the second plurality of pulse blocks.

14. The method of claim 13, wherein the second one of the second plurality of pulse blocks is controlled to be output preceding the first one of the second plurality of pulse blocks, and the second one of the first plurality of pulse blocks is controlled to be output preceding the first one of the first plurality of pulse blocks.

15. The method of claim 9, wherein the first plurality of pulse blocks includes the first one of the first plurality of pulse blocks and a second one of the first plurality of pulse blocks, wherein the second plurality of pulse blocks includes the first one of the second plurality of pulse blocks and a second one of the second plurality of pulse blocks, wherein each of the first plurality of pulse blocks includes a first portion and a second portion, wherein each of the second plurality of pulse blocks includes a first portion and a second portion, wherein the first and second pluralities of pulse blocks are in synchronization with the synchronization signal when the first portion of the first one of the first plurality of pulse blocks is controlled to be output from the first RF generator at a time the second RF generator has output the first portion of the second one of the second plurality of pulse blocks.

16. The method of claim 15, wherein the second one of the second plurality of pulse blocks is controlled to be output preceding the first one of the second plurality of pulse blocks, and the second one of the first plurality of pulse blocks is controlled to be output preceding the first one of the first plurality of pulse blocks.

17. A plasma system comprising:
    a computer;
    a first radio frequency (RF) generator coupled to the computer; and
    a second RF generator coupled to the computer,
    wherein the computer is configured to:
        provide a first recipe set to the first RF generator, wherein the first recipe set includes information regarding a first plurality of pulse blocks;
        provide a second recipe set to the second RF generator, wherein the second recipe set includes information regarding a second plurality of pulse blocks;
        generate a synchronization signal;
        provide the synchronization signal to the first RF generator to control the first RF generator to output a first one of the first plurality of pulse blocks in synchronization with the synchronization signal; and
        provide the synchronization signal to the second RF generator to control the second RF generator to output a first one of the second plurality of pulse blocks in synchronization with the synchronization signal.

18. The plasma system of claim 17, wherein the first plurality of pulse blocks includes the first one of the first plurality of pulse blocks and a second one of the first plurality of pulse blocks, wherein the second plurality of pulse blocks includes the first one of the second plurality of pulse blocks and a second one of the second plurality of pulse blocks, wherein each of the first plurality of pulse blocks includes a first portion and a second portion, wherein each of the second plurality of pulse blocks includes a first portion and a second portion, wherein the first and second pluralities of pulse blocks are in synchronization with the synchronization signal when the second portion of the first one of the first plurality of pulse blocks is controlled to be output from the first RF generator without controlling the second RF generator to output the second portion of the second one of the second plurality of pulse blocks.

19. The plasma system of claim 18, wherein the second one of the second plurality of pulse blocks is controlled to be output preceding the first one of the second plurality of pulse blocks, and the second one of the first plurality of pulse blocks is controlled to be output preceding the first one of the first plurality of pulse blocks.

20. The plasma system of claim 17, wherein the first plurality of pulse blocks includes the first one of the first plurality of pulse blocks and a second one of the first plurality of pulse blocks, wherein the second plurality of pulse blocks includes the first one of the second plurality of pulse blocks and a second one of the second plurality of pulse blocks, wherein each of the first plurality of pulse blocks includes a first portion and a second portion, wherein each of the second plurality of pulse blocks includes a first portion and a second portion, wherein the first and second pluralities of pulse blocks are in synchronization with the synchronization signal when the first portion of the first one of the first plurality of pulse blocks is controlled to be output from the first RF generator at a time the second RF generator has output the first portion of the second one of the second plurality of pulse blocks.

21. The plasma system of claim 20, wherein the second one of the second plurality of pulse blocks is controlled to be output preceding the first one of the second plurality of pulse blocks, and the second one of the first plurality of pulse blocks is controlled to be output preceding the first one of the first plurality of pulse blocks.

* * * * *